(12) United States Patent
Yang et al.

(10) Patent No.: US 11,276,604 B1
(45) Date of Patent: Mar. 15, 2022

(54) RADICAL-ACTIVATED ETCHING OF METAL OXIDES

(71) Applicant: TAIWAN SEMICONDUCTOR MANUFACTURING CO., LTD., Hsinchu (TW)

(72) Inventors: Chansyun David Yang, Shinchu (TW); Chan-Lon Yang, Taipei (TW); Keh-Jeng Chang, Hsinchu (TW); Perng-Fei Yuh, Walnut Creek, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/081,709

(22) Filed: Oct. 27, 2020

(51) Int. Cl.
| | |
|---|---|
| *H01L 21/687* | (2006.01) |
| *H01L 21/3213* | (2006.01) |
| *H01J 37/32* | (2006.01) |
| *H01L 21/311* | (2006.01) |

(52) U.S. Cl.
CPC .. *H01L 21/68757* (2013.01); *H01J 37/32018* (2013.01); *H01J 37/3244* (2013.01); *H01L 21/31116* (2013.01); *H01L 21/32136* (2013.01); *H01J 2237/3341* (2013.01)

(58) Field of Classification Search
CPC ......... H01L 21/68757; H01L 21/31116; H01L 21/32136; H01J 37/32018; H01J 37/3244; H01J 2237/3341
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2005/0211170 A1* | 9/2005 | Hanawa ............. C23C 14/358 118/723 R |
| 2019/0189479 A1* | 6/2019 | Meng ............. H01L 21/02057 |

\* cited by examiner

*Primary Examiner* — Yuechuan Yu
(74) *Attorney, Agent, or Firm* — Sterne, Kessler, Goldstein & Fox P.L.L.C.

(57) ABSTRACT

The present disclosure describes methods and systems for radical-activated etching of a metal oxide. The system includes a chamber, a wafer holder configured to hold a wafer with a metal oxide disposed thereon, a first gas line fluidly connected to the chamber and configured to deliver a gas to the chamber, a plasma generator configured to generate a plasma from the gas, a grid system between the plasma generator and the wafer holder and configured to increase a kinetic energy of ions from the plasma, a neutralizer between the grid system and the wafer holder and configured to generate electrons and neutralize the ions to generate radicals, and a second gas line fluidly connected to the chamber and configured to deliver a precursor across the wafer. The radicals facilitate etching of the metal oxide by the precursor.

20 Claims, 16 Drawing Sheets

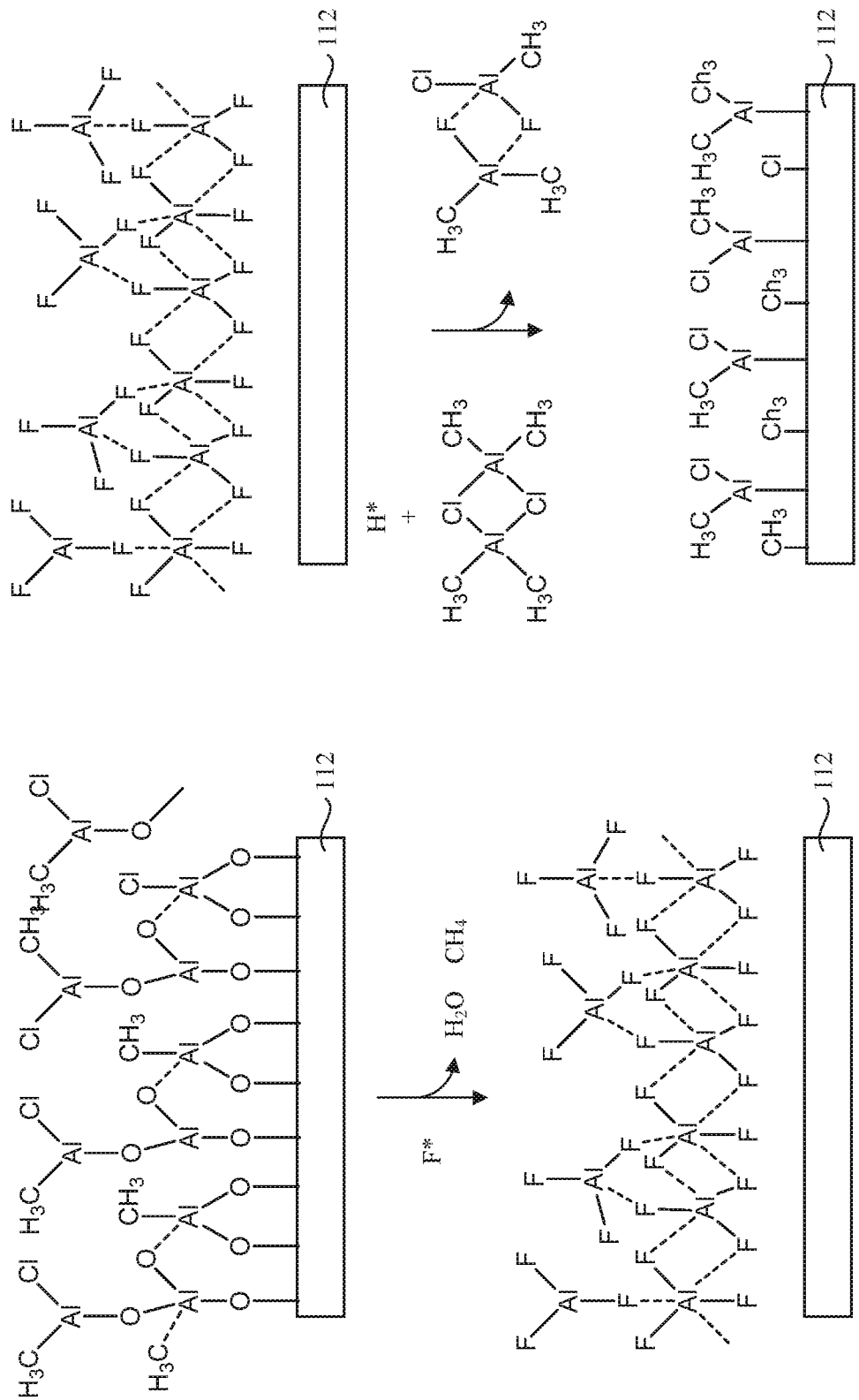

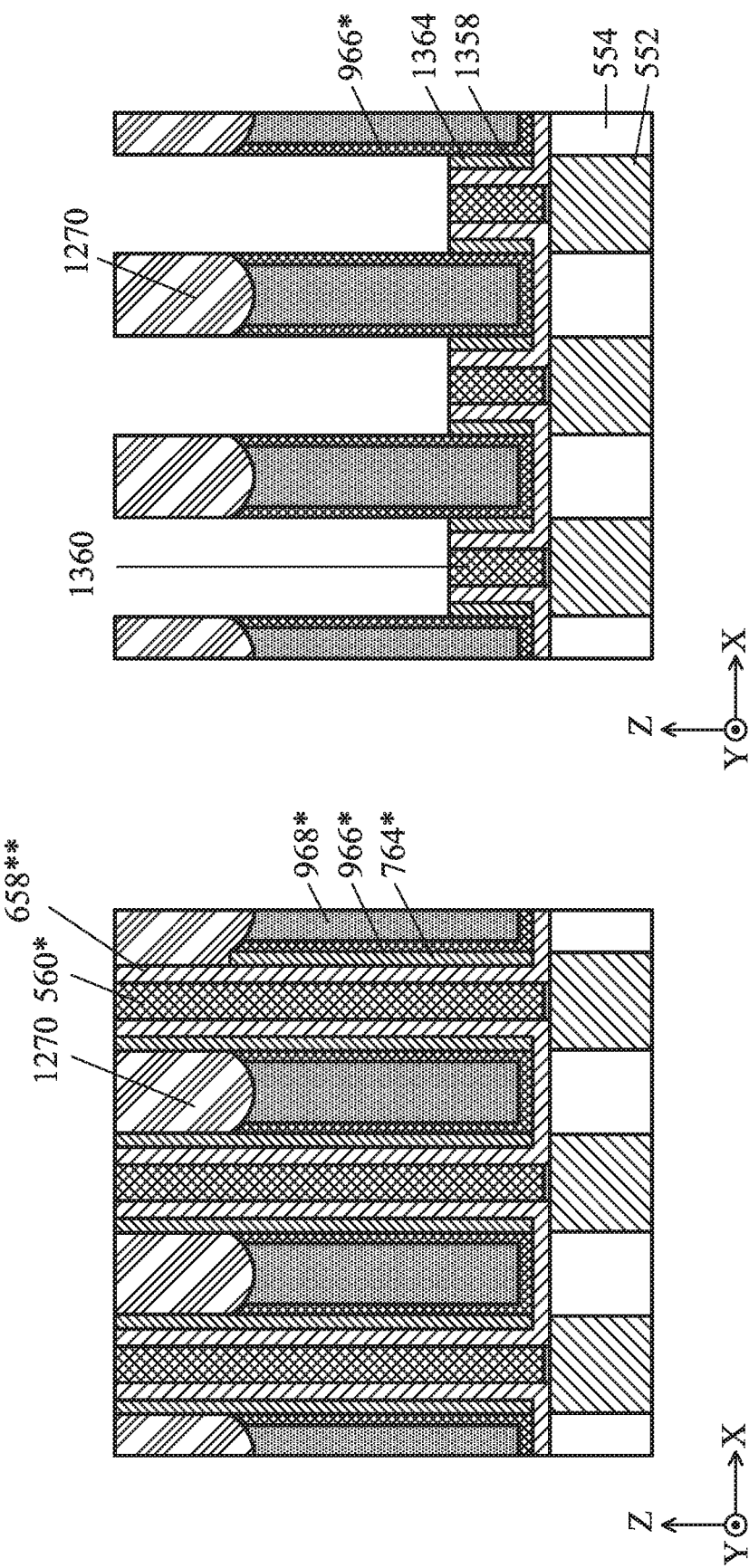

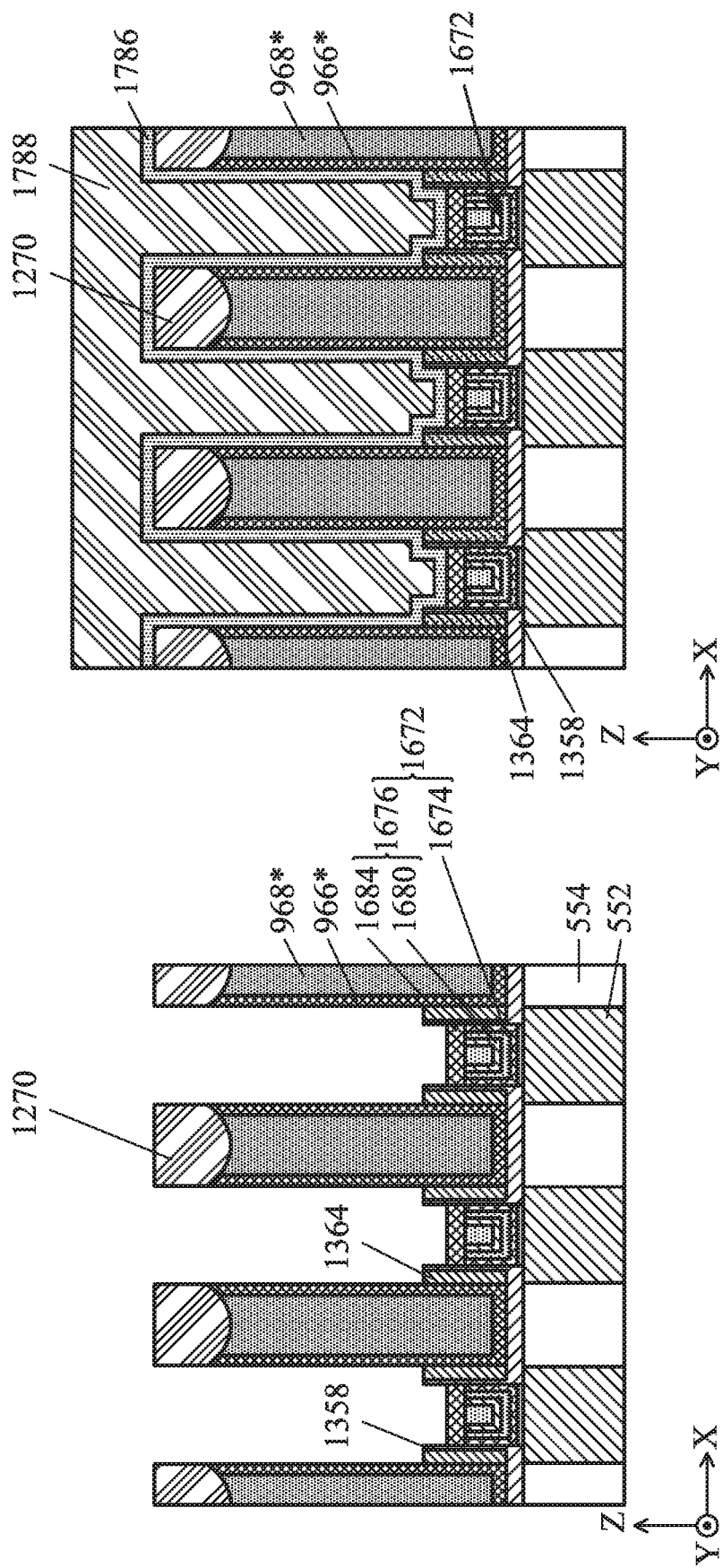

RADICAL-ACTIVATED ETCHING OF METAL OXIDES

BACKGROUND

Dry etching is a semiconductor manufacturing process that removes a masked pattern of material by exposing the material to a bombardment of ions. Before etching, a wafer can be coated with photoresist or a hard mask (e.g., oxide or nitride) and exposed to a circuit pattern during a photolithography operation. The etching process can remove material from the pattern traces. This sequence of patterning and etching can be repeated multiple times during the semiconductor manufacturing process.

BRIEF DESCRIPTION OF THE DRAWINGS

Aspects of the present disclosure are best understood from the following detailed description when read with the accompanying figures.

FIGS. 3E and 3F illustrate a surface modification cycle and a material removal cycle, respectively, of an exemplary radical-activated thermal ALE process, in accordance with some embodiments.

FIGS. 5A, 5B, 6-17, 18A, 18B, 19A, 19B, 20A, and 20B illustrate cross-sectional and isometric views of a semiconductor device having an air gap at various stages of its fabrication process using a radical-activated thermal ALE process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
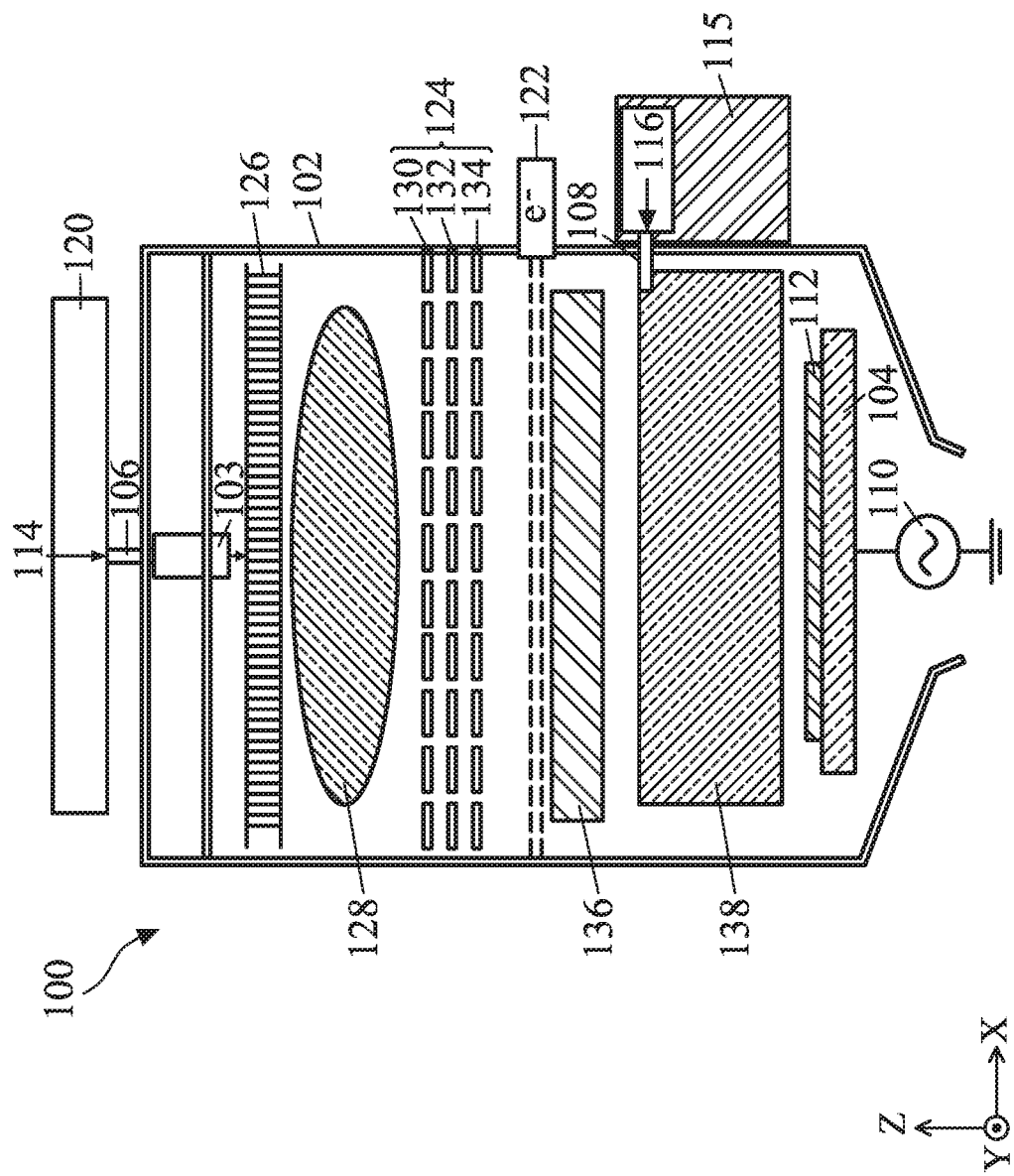
FIG. 1 illustrates a cross-sectional view of a radical-activated thermal atomic layer etching (ALE) system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Dry etching is a process used in semiconductor manufacturing. Before etching, a wafer can be coated with a photoresist or a hard mask (e.g., oxide or nitride) and a circuit pattern can be transferred on the photoresist or the hard mask using photolithographic processes (e.g., photo exposure, post exposure bake, develop, hard bake, etc.). An etching process can be subsequently used to remove material from the surface of the wafer that is not covered by the patterned photoresist or hard mask. This sequence of patterning and etching can be repeated multiple times during the semiconductor manufacturing process.

Plasma etching is performed by applying electromagnetic energy (e.g., radio frequency (RF)) to a gas that contains a chemically-reactive element, such as nitrogen trifluoride and hydrogen, to form a plasma. The plasma releases positively-charged ions that can bombard the surface of a wafer to remove, or etch, material. At the same time, chemically-reactive radicals (e.g., atoms or groups of atoms with unpaired electrons) can react with the surface of the wafer to modify surface properties. To improve etch throughput, higher etch rates (e.g., several Å/min or nm/min) are desirable.

Process chemistries can differ depending on the types of films to be etched. For example, etch chemistries used in dielectric etch applications can be fluorine-based. Silicon and metal etch applications can use chlorine-based chemistries. An etch operation can include etching one or more film layers from the surface of a wafer. When multiple layers are on the surface of the wafer, for example during the removal of a metal oxide, the etch process is required to remove the metal oxide but preserve other layers (e.g., silicon, silicon oxide, silicon nitride, etc.), the selectivity of the etch process becomes an important parameter. Selectivity of an etch chemistry or an etch process can be defined as the ratio of two etch rates: the rate for the layer to be removed to the rate for the layer to be preserved. In an etch process, high selectivity ratios (e.g., greater than 10:1) are desirable. The ions in the plasma etching can have higher kinetic energies than the radicals. Accordingly, the ions can have a higher etch rate than the radicals. However, the ions can have a lower etch selectivity than the radicals. The term "etch selectivity" can refer to the ratio of the etch rates of two different materials under the same etching conditions. A higher etch rate with higher etch selectivity can be an objective in an etch process.

Various embodiments of the present disclosure provide an exemplary radical-activated thermal atomic layer etching (ALE) process. In some embodiments, the radical-activated thermal ALE process can activate a ligand exchange reaction on a surface of a metal oxide on a wafer using radicals with increased kinetic energies, thereby increasing an etch rate of the metal oxide and increasing the etch selectivity between the metal oxide and adjacent materials on the wafer. The metal oxide can include hafnium oxide, aluminum oxide, zirconium oxide, and other suitable metal oxide dielectric materials.

Atomic layer etching, or ALE, is a technique that can remove thin layers of material from the surface of a wafer using sequential reaction cycles (e.g., duty cycles), for example, during the removal of a metal oxide on one or more dielectric layers. The sequential reaction cycles of an ALE process can be "quasi self-limiting." In some embodiments, quasi self-limiting reactions may refer to those reactions that slow down as a function of time (e.g., asymptotically), or as a function of species dosage. A radical-activated thermal ALE process can include three sequential reaction cycles: (i) a surface modification cycle, (ii) a material removal cycle, and (iii) a surface cleaning cycle. In some embodiments, a time elapsed between sequential cycles (e.g., between the surface modification cycle and the material removal cycle) is referred to as a "transition time." During the transition time, reactants/byproducts from a current cycle are removed away from the surface of the wafer, prior to the release of new reactants. Prompt delivery of reactants into the chamber can reduce the transition time between cycles and the cycle duration (cycle time). In a radical-activated thermal ALE process, the reactants can be, for example, delivered by one or more gases, a plasma, a vapor, or other suitable sources.

The surface modification cycle can form a reactive surface layer with a defined thickness from a material on the surface of a wafer that has been exposed to radicals in the surface modification process. In some embodiments, the radical-activated thermal ALE process can modify the surface of the metal oxide layer with radicals generated from a plasma during the surface modification cycle. The modified material layer (reactive surface layer) can be subsequently removed during the next cycle (e.g., material removal cycle). Any unmodified material, which is not exposed to the surface modification chemistry during the surface modification cycle, will not be removed. The modified material, for example, can have a gradient in chemical composition and/or physical structure.

The material removal cycle can include a ligand exchange reaction, which can be performed under a thermal condition. In some embodiments, radicals generated from ions of a plasma having increased kinetic energies can increase the ligand exchange kinetic energies and the speed of the ligand exchange reaction, thus increasing removal of the modified surface of the metal oxide layer and the etching rate of the metal oxide layer. In some embodiments, one or more plates with evenly distributed holes or openings can distribute the gases and plasmas uniformly across the wafer. In some embodiments, the radical-activated thermal ALE system can include a grid system to increase kinetic energies of ions from the plasma and a neutralizer to neutralize the ions and form radicals. The grid system can include a screen grid to screen ions having appropriate angles, an accelerator grid to increase kinetic energies of the ions, and a decelerator grid to reduce divergence of the beam of the ions and block electrons generated by the neutralizer from entering the grid system. The neutralizer can generate electrons and neutralize the ions to form radicals with increased kinetic energies. The material removal cycle can remove the modified material layer while keeping the unmodified material(s) or layers intact. The total amount of material removed can be controlled by the number of repeated cycles (e.g., surface modification cycle, material removal cycle, and surface cleaning cycle).

The surface cleaning cycle can remove surface residues and byproducts from the material removal cycle on the surface of the wafer with a flush of radicals and reset the surface to a near-pristine state for the next etching cycle. The radical flush can further increase the etching rate of the radical-activated thermal ALE process. The radical-activated thermal ALE technique can be used in a variety of etching schemes including, but not limited to, directional or isotropic etching (e.g., formation of air spacers) and selective or nonselective etching (e.g., removal of dielectric layers from an exposed surface).

FIG. 1 illustrates a cross-sectional view of an exemplary radical-activated thermal atomic layer etching (ALE) system 100, in accordance with some embodiments. By way of example and not limitation, radical-activated thermal ALE system 100 can include a chamber 102, a shower head 103 and a wafer holder 104 in chamber 102, a first gas line 106 and a second gas line 108 connected to chamber 102, and an electrical source 110 connected to wafer holder 104. In some embodiments, an inner surface of chamber 102 can be covered with yttrium oxide ($Y_2O_3$) to protect chamber 102 from plasmas and etch chemistries in the radical-activated ALE process. Shower head 103 can connect to first gas line 106 and release gases from first gas line 106 into chamber 102. A pressure in chamber 102 can range from about 3 mTorr to about 4 Torr. In the surface modification cycle, the pressure in chamber 102 can range from about 1 Torr to about 4 Torr. If the pressure is less than about 1 Torr or greater than about 4 Torr, a thickness of modified surface layer may be thinner or thicker than required, respectively. In the material removal cycle, the pressure in chamber 102 can range from about 100 mTorr to about 1000 mTorr. If the pressure is less than about 100 mTorr, the ligand exchange precursors may be decomposed. If the pressure is greater than about 1000 mTorr, the ligand exchange precursors may be condensed on chamber 102. In the surface cleaning cycle, the pressure in chamber 102 can range from about 20 mTorr to about 200 mTorr. If the pressure is less than about 20 mTorr, metal oxide surfaces may be damaged. If the pressure is greater than about 200 mTorr, byproducts and residues may not be completely cleaned.

Wafer holder 104 can be an electrostatic wafer chuck and configured to hold a wafer 112. Wafer 112 can be patterned and have areas of a metal oxide layer on a surface of wafer 112 exposed for etching. In some embodiments, the metal oxide layer can include hafnium oxide, aluminum oxide, zirconium oxide, and other suitable metal oxide dielectric materials. Wafer holder 104 can include a heater (not shown) to heat wafer 112. In some embodiments, wafer 112 can be heated to a temperature ranging from about 150° C. to about 300° C. for the radical-activated thermal ALE process. If the temperature is less than about 150° C., the ligand exchange reaction may not initiate and the metal oxide layer may not be removed. If the temperature is greater than about 300° C., the radical-activated thermal ALE process may have less etch selectivity between the metal oxide layer and adjacent structures and cause surface damage to the adjacent structures. In some embodiments, wafer holder 104 can be biased by electrical source 110 to provide vertical profile control for a directional etch process. For example, in the surface modification cycle and the surface cleaning cycle, a small amount of ions (e.g., less than about 5%) in radicals 136 can provide a vertical etch profile and a faster etch rate with bias control by electrical source 110.

First gas line 106 can connect to a gas panel 120, which can provide a gas 114 to chamber 102 to generate radicals for the radical-activated thermal ALE process. In some embodiments, gas panel 120 can provide gases including fluorine ($F_2$), hydrogen fluoride (HF), nitrogen trifluoride ($NF_3$), carbon tetrafluoride ($CF_4$), trifluoromethane ($CHF_3$), hexafluorobutadiene ($C_4F_6$), octafluorocyclobutane ($C_4F_8$), sulfur hexafluoride ($SF_6$), hydrogen ($H_2$), helium (He), and argon (Ar). In some embodiments, gas 114 can include $F_2$, HF, $NF_3$, $CF_4$, $CHF_3$, $C_4F_6$, $C_4F_8$, and $SF_6$ to generate plasmas and fluorine radicals for modifying the surface of the metal oxide layer. In some embodiments, gas 114 can include inert gases, such as He and Ar, to generate radicals with increased kinetic energies for activing ligand exchange precursors and speeding up ligand exchange reaction. In some embodiments, gas 114 can include $H_2$ and He to generate radicals for cleaning the surface of the metal oxide layer after the ligand exchange reaction. In some embodiments, gas 114 can include He for a transition cycle after each cycle of the radical-activated thermal ALE process to pump and purge chamber 102, preventing intermixing of gases and plasmas of different cycles. In some embodiments, the transition cycle can last from about 30 s to about 60 s. In some embodiments, the plasma and radicals of He can be more effectively pumped and purged than $H_2$. In some embodiments, a plasma generator (shown in FIG. 2) can generate plasmas from gas 114 provided to shower head 103 from gas panel 120 through first gas line 106. In some embodiments, plasmas of gas 114 can be generated outside chamber 102 and first gas line 106 can direct plasmas of gas 114 to shower head 103 in chamber 102.

Second gas line 108 can connect to a vaporizer 115 and control a gas flow of a vapor 116 flowing from vaporizer 115 into chamber 102. Vaporizer 115 can convert a ligand exchange precursor from liquid to vapor 116, which can be drawn to chamber 102 by the vacuum in chamber 102. In some embodiments, a flow rate of vapor 116 can range from about 50 sccm to about 900 sccm. If the flow rate of vapor 116 is less than about 50 sccm, the modified surface may not be fully removed. If the flow rate of vapor 116 is greater than about 900 sccm, ligand residues may form on the surface of wafer 112.

Radical-activated thermal ALE system 100 can further include a gas distribution plate 126, a grid system 124, and a neutralizer 122 in chamber 102. In some embodiments, gas distribution plate 126 can have evenly distributed openings or concentric openings to uniformly distribute gas 114 delivered into chamber 102. Plasma region 128 can be formed between gas distribution plate 126 and grid system 124 by a plasma generator shown in FIG. 2. When gas 114 is delivered to chamber 102 through first gas line 106 and shower head 103, plasma region 128 can be formed including ions and radicals of gas 114. Grid system 124 can include a screen grid 130, an accelerator grid 132, and a decelerator grid 134. Grid system 124 can increase kinetic energies of the ions from the plasmas of plasma region 128. Neutralizer 122 can neutralize the ions with increased kinetic energies and generate radicals 136 with increased kinetic energies. Radicals 136 with increased kinetic energies can transfer the kinetic energies to vapor 116 of ligand exchange precursors and generate activated gas region 138 to react with modified surface of the metal layer on wafer 112.

Figure 2:
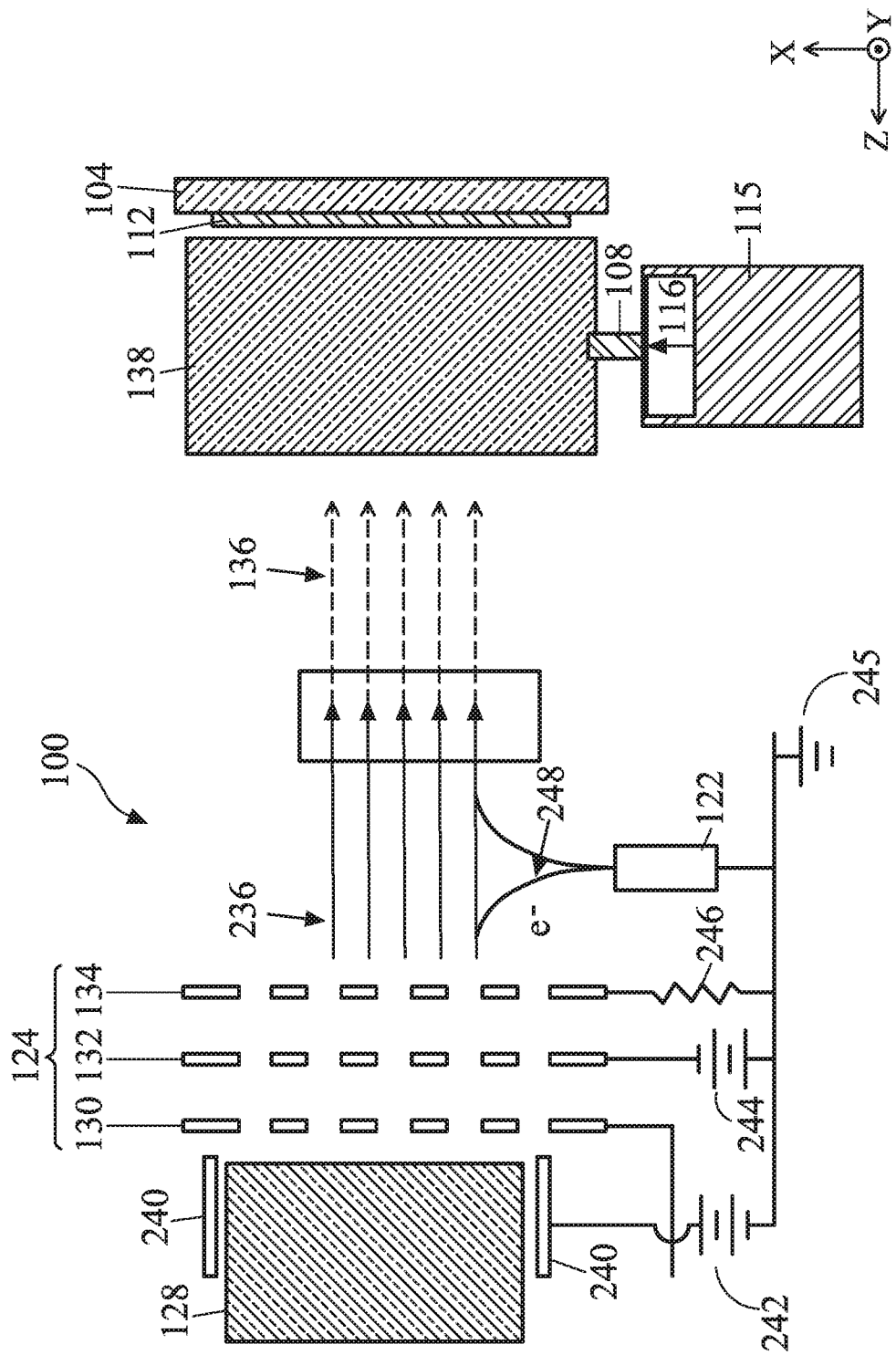
FIG. 2 illustrates a cross-sectional view of a grid system and a neutralizer of a radical-activated thermal ALE system, in accordance with some embodiments.

FIG. 2 illustrates a cross-sectional view of grid system 124 and neutralizer 122 of radical-activated thermal ALE system 100, in accordance with some embodiments. As shown in FIG. 2, plasma region 128 can be generated between plates of plasma generator 240 using a power supply 242. In some embodiments, power supply 242 can be a direct current (DC) power supply. Referring to FIG. 2, grid system 124 can have screen grid 130, accelerator grid 132, and decelerator grid 134 aligned in the path of the ions towards wafer 112. Screen grid 130 can be in contact with plasma region 128. Screen grid 130 can be biased at a positive voltage relative to a ground to separate ions from plasma region 128 having appropriate angles (e.g., about 90 degrees relative to screen grid 130). In some embodiments, screen grid 130 can be biased at a positive voltage ranging from about 500 V to about 2000 V by power supply 242. Accelerator grid 132 can be disposed between screen grid 130 and decelerator grid 134. Accelerator grid 132 can be biased at a negative voltage related to a ground to accelerate the ions screened by screen grid 130. In some embodiments, accelerator grid 132 can be biased at a negative voltage ranging from about −50 V to about −400 V by power supply 244. A voltage different between accelerator grid 132 and screen grid 130 can create an electric field to accelerate the ions, thereby increasing kinetic energies of the ions. Decelerator grid 134 can be disposed between decelerator grid 134 and neutralizer 122. Decelerator grid 134 can connect to a ground 245 (e.g., 0 V) through a resistor 246. Decelerator grid 134 can reduce divergence of a beam of the accelerated ions and form ion beam 236 with increased kinetic energies. A voltage different between decelerator grid 134 and accelerator grid 132 can create another electric field to prevent electrons generated by neutralizer from entering grid system 124.

Referring to FIG. 2, neutralizer 122 can be disposed after decelerator grid 134 on the path of the ions from plasma region 128. Neutralizer 122 can generate electrons 248 to neutralize the ions in ion beam 236. As ion beam 236 includes ions with increased kinetic energies from grid system 124, neutralizer 122 can neutralize the ions with electrons 248 and form radicals 136 with increased kinetic energies. In some embodiments, neutralizer 122 can generate electrons 248 at a rate that balances positive charges of the ions in ion beam 236.

Figure 3B:
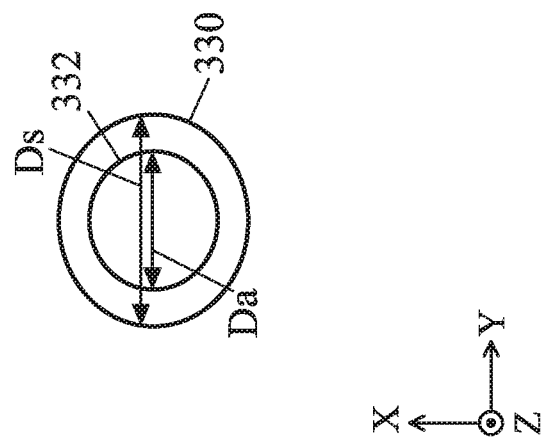
FIGS. 3A-3D illustrate top-down and side views of a grid system of a radical-activated thermal ALE system, in accordance with some embodiments.
Figure 3A:
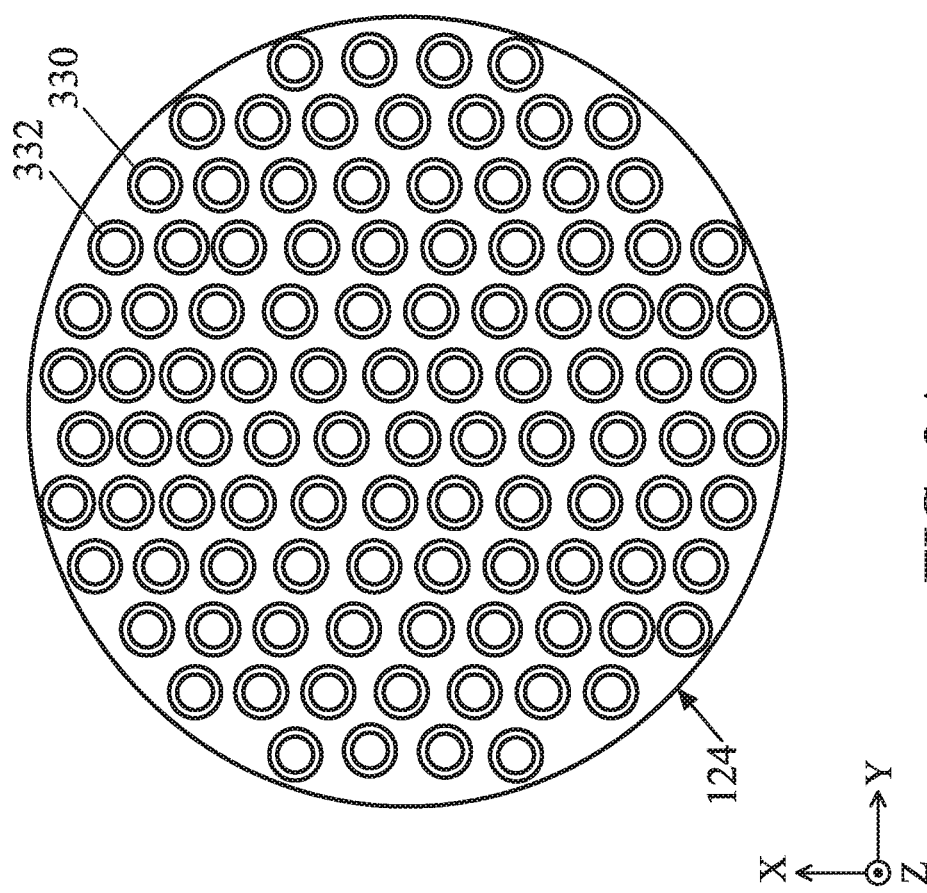
Figure 3D:
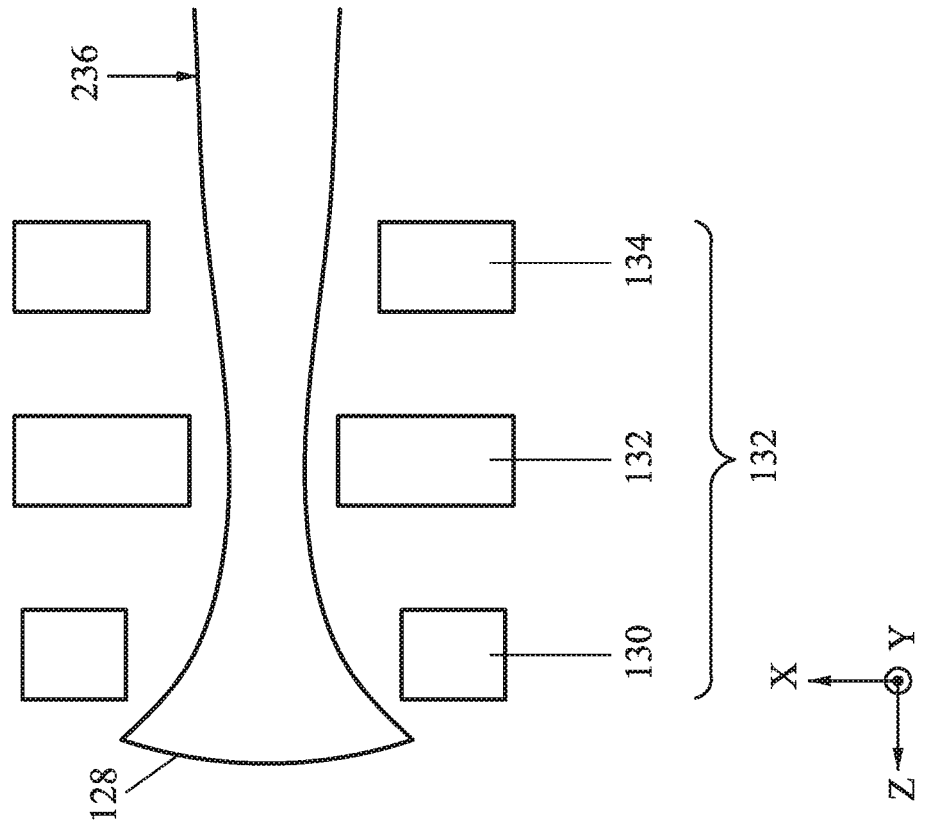
Figure 3C:
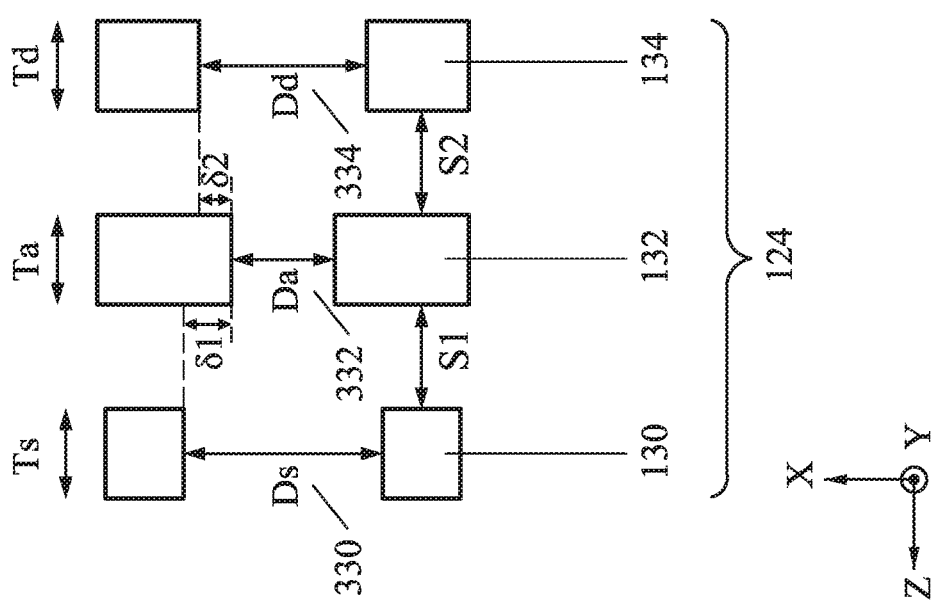

FIGS. 3A and 3B illustrate top-down views of grid system 124 of radical-activated thermal ALE system 100, in accordance with some embodiments. FIGS. 3C and 3D illustrate side views of apertures and ion beams in grid system 124, in accordance with some embodiments. As shown in FIG. 3A, the grids in grid system 124 can have apertures evenly distributed on the grids. In some embodiments, as shown in FIGS. 3B-3D, a diameter Ds of apertures 330 on screen grid 130 can be larger than a diameter Da of apertures 332 on accelerator grid 132. And a diameter Dd of the apertures on decelerator grid 134 can be larger than diameter Da of apertures 332 on accelerator grid 132. As a result, apertures 332 can be seen inside apertures 330 from top-down views in FIGS. 3A and 3B while the apertures on decelerator grid 134 may not be seen from top-down views. In some embodiments, diameter Ds can range from about 4 mm to about 7 mm. Diameter Da can range from about 2 mm to about 5 mm. Diameter Dd can range from about 3 mm to about 7 mm. For example, diameter Ds can be about 5 mm, diameter Da can be about 3.5 mm, and diameter Dd can be about 4.5 mm. In some embodiments, a difference δ1 between diameters Ds and Da can range from about 0.5 mm to about 4 mm. In some embodiments, as shown in FIG. 3C, a different 82 between diameters Dd and Da can range from about 0.5 mm to about 2.5 mm. For example, difference 61 can be about 1.5 mm and difference δ2 can be about 1 mm. Screen grid 130 with diameter Ds greater than diameter Da of accelerator grid 132 can increase the number of ions in ion beam 236. Accelerator grid 132 with diameter Da less than diameter Ds can accelerate and focus ions in ion beam 236. In some embodiments, diameter Ds can be greater than, less than, or the same as diameter Dd. In some embodiments, screen grid 130 can have a thickness Ts along a Z-axis ranging from about 0.3 mm to about 0.8 mm. In some embodiments, accelerator grid 132 can have a thickness Ta along a Z-axis ranging from about 0.4 mm to about 1 mm. In some embodiments, decelerator grid 134 can have a thickness Td along a Z-axis ranging from about 0.4 mm to about 1.2 mm. For example, thickness Ts can be about 0.4 mm, thickness Ta can be about 0.5 mm, and thickness Td can be about 0.7 mm. In some embodiments, as shown in FIG. 3C, a separation space S1 between screen grid 130 and accelerator grid 132 along a Z-axis can range from about 0.4 mm to about 0.6 mm. And a separation space S2 between accelerator grid 132 and decelerator grid 134 along a Z-axis can range from about 0.5 mm to about 0.7 mm. For example, separation space S1 can be about 0.5 mm and separation space S2 can be about 0.6 mm. With the configurations of screen grid 130, accelerator grid 132, and decelerator grid 134 as shown in FIGS. 3A-3D, ions in plasma 128 can be focused through these grids without direct interception and form ion beam 236. Misalignment of these grids and out of range for the diameters and thicknesses can lead to direct interception of ion beam 236 on the grids, which can cause erosion to the grids by ions in ion beam 236 with increased kinetic energies. In some embodiments, FIGS. 3E and 3F illustrate a surface modification cycle and a material removal cycle, respectively, of an exemplary radical-activated thermal ALE process, which are described in detail below.

Figure 4:
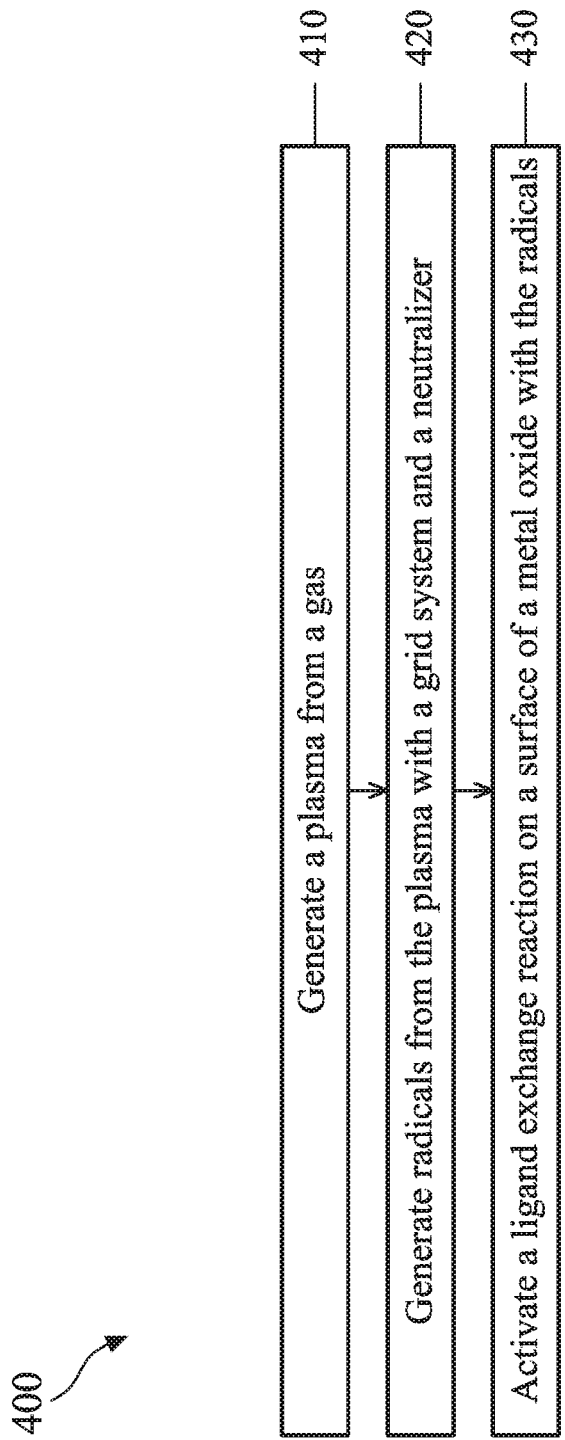
FIG. 4 illustrates a method of radical-activated thermal ALE of a metal oxide, in accordance with some embodiments.

FIG. 4 illustrates method 400 of radical-activated thermal ALE of a metal oxide, in accordance with some embodiments. Additional operations may be performed between various operations of method 400 and may be omitted merely for clarity and ease of description. Additional operations can be provided before, during, and/or after method 400; one or more of these additional processes are briefly described herein. Therefore, method 400 may not be limited to the operations described below.

Method 400 can be performed by exemplary radical-activated thermal ALE system 100 shown in FIGS. 1, 2, and 3A-3F and other suitable radical-activated thermal ALE systems. For illustrative purposes, the operations in FIG. 4 will be described with reference to exemplary radical-activated thermal ALE system 100 shown in FIGS. 1, 2, and 3A-3F. As shown in FIGS. 1, 2, and 3A-3F, radical-activated thermal ALE system 100 can include first gas line 106 to deliver gas 114 from gas panel 120 to chamber 102 and second gas line 108 to deliver vapor 116 to chamber 102. Shower head 103 can release gases from first gas line 106 to chamber 102. Wafer holder 104 can hold and heat wafer 112 having the metal oxide layer on the surface exposed for etching. Plasma generator 240 can generate a plasma from gas 114.

Referring to FIG. 4, method 400 begins with operation 410 and the process of generating a plasma from a gas. As shown in FIGS. 1 and 2, plasma generator 240 can generate a plasma in plasma region 128 from a gas 114. Gas 114 can be delivered from gas panel 120 to shower head 103 in chamber 102 through first gas line 106. Gas 114 can include $F_2$, HF, $NF_3$, $CF_4$, $CHF_3$, $C_4F_6$, $C_4F_8$, $SF_6$, He, Ar, $H_2$, and He to generate plasmas for different cycles of the radical-activated thermal ALE process. Gas distribution plate 126 can have evenly distributed openings or concentric openings to uniformly distribute gas 114 delivered into chamber 102. Plasma generator 240 can generate a plasma from gas 114 in plasma region 128 using power supply 242.

Referring to FIG. 4, method 400 continues with operation 420 and the process of generating radicals from the plasma with a grid system and a neutralizer. The grid system can include a screen grid, an accelerator grid, and a decelerator grid. As shown in FIG. 2, grid system 124 can generate ion beam 236 with increased kinetic energies from the plasma in plasma region 128. Neutralizer 122 can generate electrons 248 to neutralize the ions in ion beam 236 and form radicals 136 with increased kinetic energies. Grid system 124 can include screen grid 130, accelerator grid 132, and decelerator grid 134. Screen grid 130 can be biased at a positive voltage relative to a ground to separate ions from plasma region 128 having appropriate angles (e.g., about 90 degrees relative to screen grid 130). Accelerator grid 132 can be biased at a negative voltage related to a ground to accelerate the ions screened by screen grid 130. After accelerator grid 132, the ions can have increased kinetic energies. Decelerator grid 134 can connect to a ground 245 through a resistor 246 to reduce divergence of a beam of the accelerated ions and form ion beam 236 having increased kinetic energies. In addition, decelerator grid 134 can prevent electrons generated by neutralizer 122 from entering grid system 124.

Referring to FIG. 4, method 400 continues with operation 430 and the process of activating a ligand exchange reaction on a surface of a metal oxide with the radicals. As shown in FIGS. 1 and 2, radicals 136 with increased kinetic energies can transfer kinetic energies to vapor 116 and activate vapor 116 of ligand exchange precursor to form activated gas region 138. The activated ligand exchange vapors in gas region 138 can remove the modified surface of the metal oxide layer on wafer 112 and speed up the ligand exchange reaction. In some embodiments, without radicals having increased kinetic energies, the ligand exchange reaction can remove the metal oxide at an etch rate ranging from about 0.1 Å per cycle to about 0.6 Å per cycle. In some embodiments, with radicals 136 having increased kinetic energies, the ligand exchange reaction can remove the metal oxide at an etch rate ranging from about 1 Å per cycle to about 5 Å per cycle. In some embodiments, radicals 136 having increased kinetic energies can increase the etch rate of the metal oxide by about 3 to about 10 times.

In some embodiments, radicals with increased kinetic energies can be generated in each cycle of the radical-activated thermal ALE process. In the surface modification cycle, the surface of the metal oxide layer on wafer 112 can be fluorinated by fluorine radicals, as shown in FIG. 3E. The fluorine radicals can be generated from the plasma of gas 114 through grid system 124 and neutralizer 122, as shown in FIGS. 1 and 2. In some embodiments, the metal oxide layer on wafer 112 can include aluminum oxide and gas 114 can include $NF_3$, $F_2$, HF, $CF_4$, $CHF_3$, $C_4F_6$, $C_4F_8$, or $SF_4$ for the surface modification cycle. In some embodiments, $NF_3$ plasma can be generated at a pressure ranging from about 1 Torr to about 4 Torr with a power ranging from about 400 W to about 700 W. $NF_3$ gas flow rate can range from about 100 sccm to about 500 scan. A gas flow rate of $H_2$ or He can range from about 1000 sccm to about 3000 sccm. A temperature of wafer holder 104 can range from about 250° C. to about 300° C. for the surface modification cycle. In some embodiments, a plasma of $F_2$, HF, $CF_4$, $CHF_3$, or $SF_6$ can be generated at a pressure ranging from about 0.1 Torr to about 2 Torr with a flow rate ranging from about 100 sccm to about 500 sccm. The plasma power can range from about 500 W to about 800 W. A gas flow rate of $H_2$ or He can range from about 500 sccm to about 4000 sccm. In some embodiments, a plasma of $C_4F_6$ or $C_4F_8$ can be generated at a pressure ranging from about 30 mTorr to about 200 mTorr with a flow rate ranging from about 10 scan to about 50 sccm. The plasma power can range from about 500 W to about 900 W. A gas flow rate of $H_2$ or He can range from about 500 sccm to about 200 sccm.

Grid system 124 can generate ions with increased kinetic energy and neutralizer 122 can generate electrons to neutralize the ions and form radicals 136 with increased kinetic energy for the surface modification cycle. In some embodiments, screen grid 130 can be biased at about 1.2 kV. Accelerator grid 132 can be biased at a voltage ranging from about −100 V to about −400 V. Decelerator grid 134 can be connected to ground 245. Neutralizer 122 can generate electrons with a discharge current ranging from about 0.2 amperes (A) to about 0.5 Å and a mass flow rate ranging from about 0.2 mg/s to about 0.25 mg/s to neutralize the ions and form radicals 136 with increased kinetic energies. As radicals can have higher etch selectivity than ions, radicals 136 with increased kinetic energies can increase etch selectivity between the metal oxide and adjacent structures (e.g., a mask layer) and prevent surface damage to the adjacent structures.

An etch time of the surface modification cycle can range from about 10 s to about 30 s and a depth of fluorinated metal oxide on the surface of the metal oxide layer can range from about 3 Å to about 30 Å after the surface modification cycle. If the depth of fluorinated metal oxide is less than about 3 Å, the surface of the metal oxide layer may not be fully fluorinated for the ligand exchange reaction. If the depth of fluorinated metal oxide is greater than about 30 Å, the fluorinated metal oxide may not be fully removed by the ligand exchange reaction and ligand residues and byproducts may remain on the surface after the ligand exchange reaction. In some embodiments, FIG. 3E illustrates a surface modification cycle of an exemplary radical-activated thermal ALE process using fluorine radicals to fluorinate the surface of the metal oxide layer on wafer 112.

The surface modification cycle can be followed by the material removal cycle. The fluorinated metal oxide on the surface of the metal oxide layer can be removed by a ligand exchange reaction, as shown in FIGS. 1, 2, and 3F. In some embodiments, gas 114 can include $H_2$ or an inert gas, such as He and Ar, at a flow rate ranging from about 1000 sccm to about 5000 sccm. A plasma of $H_2$, He, or Ar can be generated at a pressure ranging from about 100 mTorr to about 1000 mTorr. The plasma can be generated by a plasma source with a pulsing power ranging from about 250 W to about 500 W and a duty cycle from about 10% to about 80%.

Grid system 124 can generate ions with increased kinetic energy from gas 114 and neutralizer 122 can generate electrons to neutralize the ions and form radicals 136 with increased kinetic energy for the ligand exchange reaction. In some embodiments, screen grid 130 can be biased at about 1.2 kV. Accelerator grid 132 can be biased at a voltage ranging from about −50 V to about −600 V. Decelerator grid 134 can be connected to ground 245. Neutralizer 122 can generate electrons with a discharge current ranging from about 0.2 Å to about 0.5 Å and a mass flow rate ranging from about 0.2 mg/s to about 0.25 mg/s to neutralize the ions and form radicals 136 with increased kinetic energies. Radicals 136 with increased kinetic energies can transfer kinetic energies to vapor 116 of ligand exchange precursor and form activated gas region 138, speeding up the ligand exchange reaction at the surface of the metal oxide layer.

In some embodiments, the ligand exchange reaction can be performed at a temperature ranging from about 250° C. to about 300° C. and a temperature of wafer holder 104 can range from about 250° C. to about 300° C. In some embodiments, vapor 116 can include metal precursors, such as trimethyl-aluminum chloride ($Al(CH_3)_3$ or TMA), diethyl-aluminum chloride (($AlCl(CH_3)_2$ or DMAC), tin (II) acetylacetonate ($Sn(acac)_2$), silicon tetrachloride ($SiCl_4$), and boron trichloride ($BCl_3$). In some embodiments, vapor 116 can have a flow rate ranging from about 50 sccm to about 900 sccm. In some embodiments, a time of the ligand exchange reaction in material removal cycle can range from about 10 s to about 50 s and the ligand exchange reaction can remove the fluorinated metal oxide on the surface of the metal oxide layer with a thickness ranging from about 3 Å to about 30 Å. If the time of the ligand exchange reaction is less than about 10 s, some of the fluorinated metal oxide may not be removed. If the time of the ligand exchange reaction is greater than about 50 s, ligand residues and byproducts may be formed on the surface of the metal layer after the fluorinated metal oxide are removed. In some embodiments, FIG. 3F illustrates a material removal cycle of an exemplary radical-activated thermal ALE process using hydrogen radicals to increase kinetic energies of ligand exchange precursor.

The material removal cycle can be followed by the surface cleaning cycle. The surface cleaning cycle can remove ligand residues and byproducts on the surface of the metal oxide layer with hydrogen or helium radicals and create a fresh surface for the next etching cycle, as shown in FIGS. 1 and 2. In some embodiments, gas 114 can include $H_2$ or He at a flow rate ranging from about 100 sccm to about 1000 sccm. In some embodiments, a plasma of $H_2$ or He can be generated at a pressure ranging from about 20 mTorr to about 200 mTorr. The plasma can be generated by a plasma source with a pulsing power ranging from about 150 W to about 400 W and a duty cycle from about 10% to about 80%. In some embodiments, a temperature of wafer holder 104 can range from about 250° C. to about 300° C. for the surface cleaning cycle. In some embodiments, a time of the surface cleaning cycle can range from about 10 s to about 30 s to remove the ligand residues and byproducts on the surface of the metal oxide layer by the hydrogen or helium radicals with increased kinetic energies. If the time of the surface cleaning cycle is less than about 10 s, the ligand residues and byproducts may remain on the surface of the metal oxide layer and they can block the next cycle of surface modification. If the time of the surface cleaning cycle is greater than about 30 s, exposed areas of other materials (e.g., silicon oxide, silicon nitride, silicon, etc.) may be damaged.

Grid system 124 can generate ions with increased kinetic energy from gas 114 and neutralizer 122 can generate electrons to neutralize the ions and form radicals 136 with increased kinetic energy for the surface cleaning cycle. In some embodiments, screen grid 130 can be biased at about 1.2 kV. Accelerator grid 132 can be biased at a voltage ranging from about −50 V to about −200 V. Decelerator grid 134 can be connected to ground 245. Neutralizer 122 can generate electrons with a discharge current ranging from about 0.2 Å to about 0.5 Å and a mass flow rate ranging from about 0.2 mg/s to about 0.25 mg/s to neutralize the ions and form radicals 136 with increased kinetic energies. As radicals can have higher etch selectivity than ions, radicals 136 with increased kinetic energies can increase etch selectivity between the metal oxide and adjacent structures (e.g., a mask layer) and prevent surface damage to the adjacent structures. As a result, radicals 136 can remove the ligand residues and byproducts on the surface of metal oxide layer and create a fresh surface without damaging the adjacent structures.

Figures 5A, 5B:
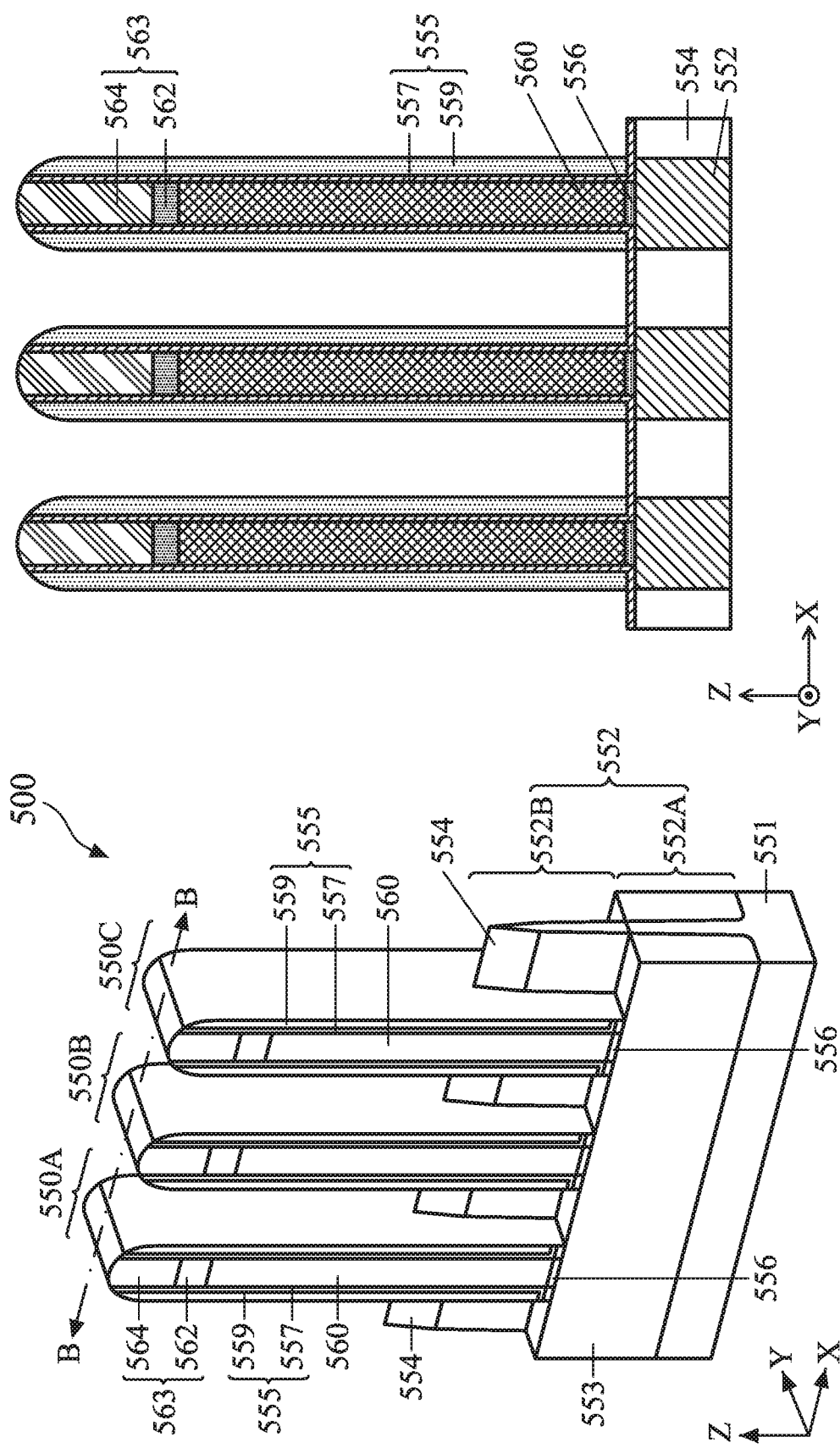

FIG. 5A illustrates an isometric view of semiconductor device 500 after the formation of epitaxial fin structures 554, in accordance with some embodiments. FIGS. 5B, 6-17, 18A, 18B, 19A, 19B, 20A, and 20B illustrate partial cross-sectional views along line B-B of semiconductor device 500 in FIG. 5A at various stages of its fabrication process to form air spacers 1964 using the radical-activated thermal ALE process described above, in accordance with some embodiments. Semiconductor device 500 can include planar metal oxide semiconductor field-effect transistors (MOSFETs) or fin field effect transistors (finFETs). As shown in FIG. 5A, semiconductor device 500 can be formed on a substrate 551 and can include finFETs 550A-550C. In some embodiments, finFETs 550A-550C can be all p-type finFETs (PFETs) or n-type finFETs (NFETs) or a combination of each type of finFETs. Though three finFETs are shown in FIGS. 5A, 5B, and subsequent figures, semiconductor device 500 can have any number of finFETs. The discussion of elements of finFETs 550A-550C with the same annotations applies to each other, unless mentioned otherwise. In addition, semiconductor device 500 can be incorporated into an integrated circuit through the use of other structural components, such as gate contact structures, conductive vias, conductive lines, dielectric layers, and passivation layers, which are not shown for the sake of clarity.

As shown in FIGS. 5A and 5B, semiconductor device 500 can further include shallow trench isolation (STI) region 553, fin structures 552, epitaxial fin structures 534, sacrificial gate structures 560, hard mask layer 363, and gate spacers 555 disposed on opposite sides of sacrificial gate structures 560. STI region 553 can be configured to provide electrical isolation between finFETs 550A-550C from each other and from neighboring finFETs with different fin structures (not shown) on substrate 551 and/or neighboring active and passive elements (not shown) integrated with or deposited on substrate 551. Fin structures 552 of semiconductor device 500 can extend along an X-axis and through finFETs 550A-550C. Fin structures 552 can include fin bottom portion 552A and fin top portion 552B disposed on fin bottom portion 552A. Epitaxial fin structures 554 can be grown on portions of fin bottom portion 552A that are not underlying sacrificial gate structures 560. Sacrificial gate structures 560 can be formed on fin structures 552 over substrate 551. Gate spacers 555 can be disposed on sidewalls of sacrificial gate structures 560 to protect sacrificial gate structures 560 during the formation of epitaxial fin structures 554. In some embodiments, gate spacers 555 can include a first gate spacer 557 and a second gate spacer 559. A hard mask layer 563 can be disposed on sacrificial gate structures 560 to protect sacrificial gate structures 560 during various processing operations (e.g., during formation of gate spacers 555 and/or epitaxial fin structures 554). In some embodiments, hard mask layer 563 can include a nitride layer 562 and an oxide layer 564 for profile control of sacrificial gate structures 560. In some embodiments, protective oxide layers 556 can be disposed between fin structures 552 and sacrificial gate structures 560.

Figure 7:
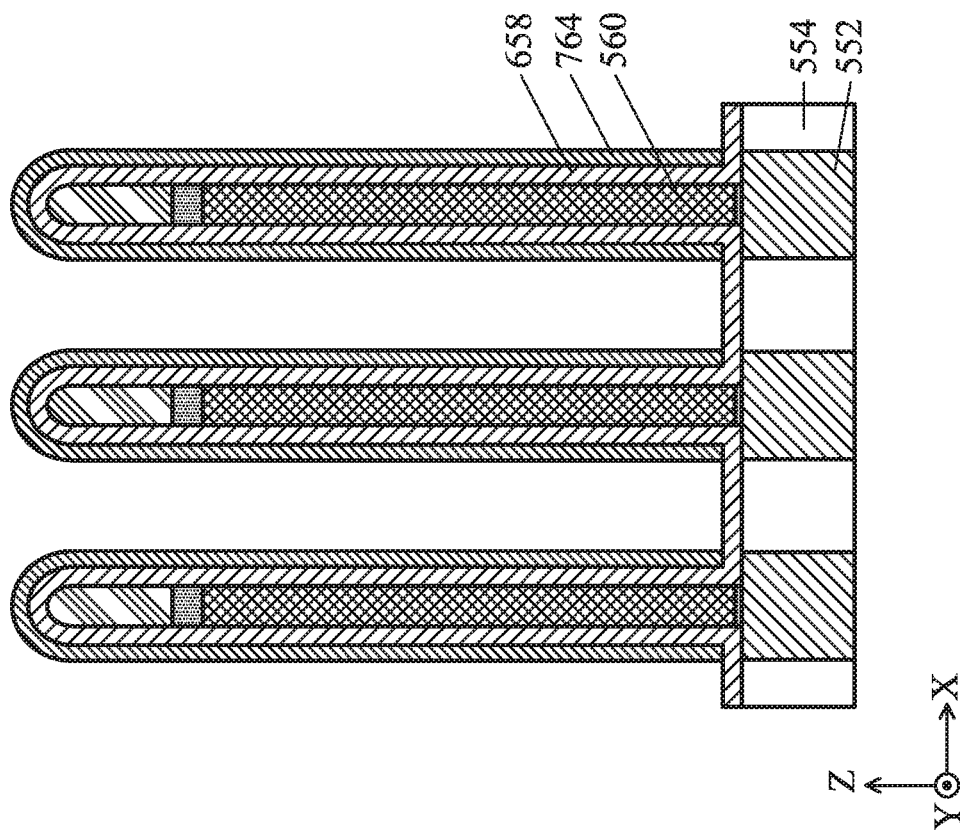
Figure 6:
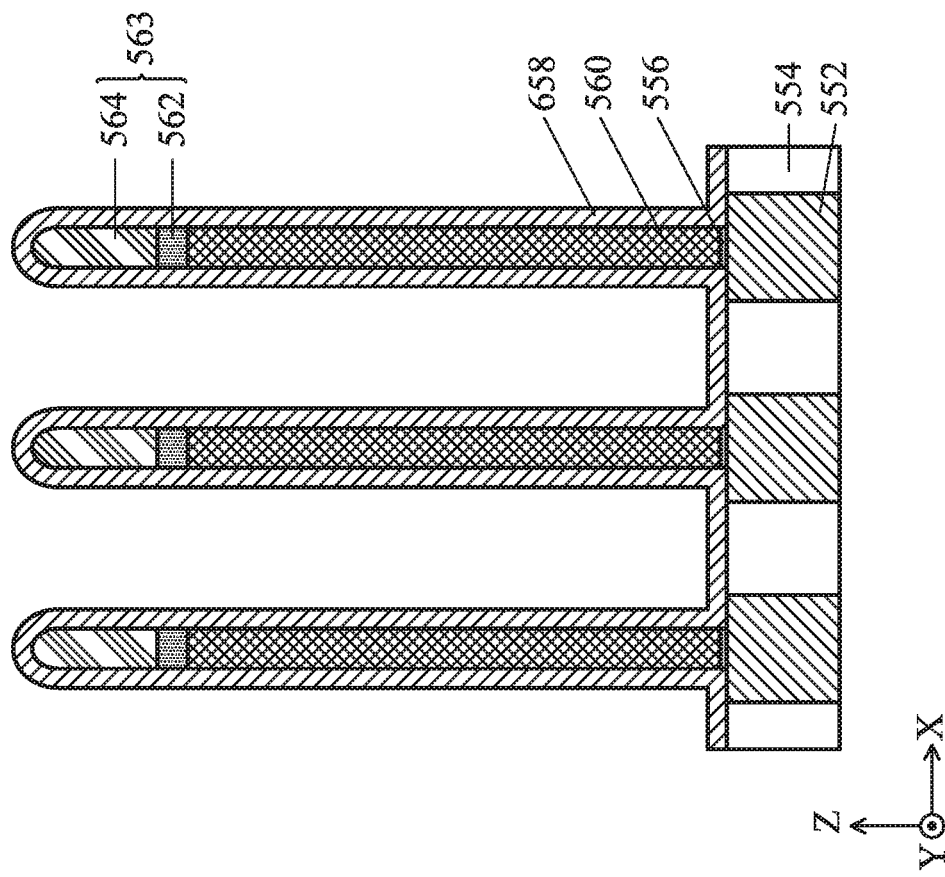

The formation of epitaxial fin structures 554 can be followed by removal of gate spacers 555 and deposition of a third gate spacer 658, as shown in FIG. 6. According to some embodiments, gate spacers 555 can be damaged (e.g., partially etched off) during the formation of epitaxial fin structures 554. As a result, gate spacers 555 can be removed after the formation of epitaxial fin structures 554 and third gate spacer 658 can be deposited on sidewalls of sacrificial gate structures 560 having improved structural integrity and few defects than damaged gate spacers 555. In some embodiments, third gate spacer 658 can have a thickness ranging from about 2 nm to about 3 nm and include dielectric materials similar to first gate spacer 557. The deposition of third gate spacer 658 can be followed by deposition of an aluminum oxide layer 764, as shown in FIG. 7. Aluminum oxide layer 764 can be deposited by atomic layer deposition (ALD), chemical vapor deposition (CVD), or other suitable deposition methods. In some embodiments, aluminum oxide layer 764 can be deposited by ALD at a temperature ranging from about 180° C. to about 300° C. using aluminum precursors, such as TMA. In some embodiments, aluminum oxide layer 764 can have a thickness ranging from about 2 nm to about 4 nm.

Figure 8:
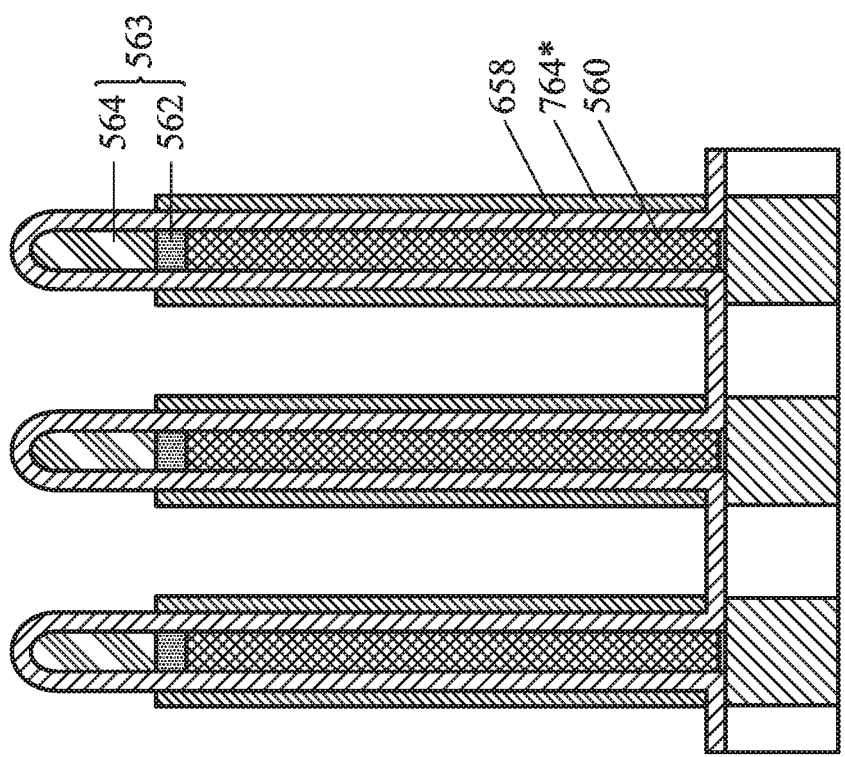

The deposition of aluminum oxide layer 764 can be followed by removal of a portion of aluminum oxide layer 764, as shown in FIG. 8. Referring to FIG. 8, a portion of aluminum oxide layer 764 can be removed by the radical-activated thermal ALE process discussed above using radical-activated thermal ALE system 100 shown in FIGS. 1 and 2. The radical-activated thermal ALE process can be a directional etching process and remove aluminum oxide layer 764 over hard mask layer 563 and epitaxial fin structures 554 to form aluminum oxide layer 764*. After the radical-activated thermal ALE process, aluminum oxide layer 764* can remain on sidewalls of sacrificial gate structures 560. In some embodiments, the radical-activated thermal ALE process can remove the portion of aluminum oxide layer 764 at a higher etching rate ranging from about 1 Å to about 5 Å per etching cycle. In addition, the radical-activated thermal ALE process can prevent third gate spacer 658 from surface damage during the removal of the portion of aluminum oxide layer 764.

Figure 9:
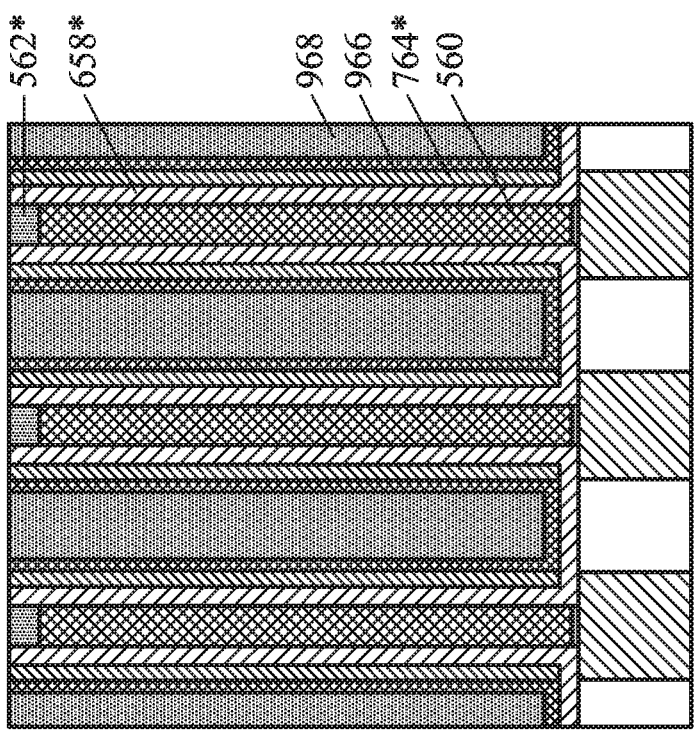
Figure 10:
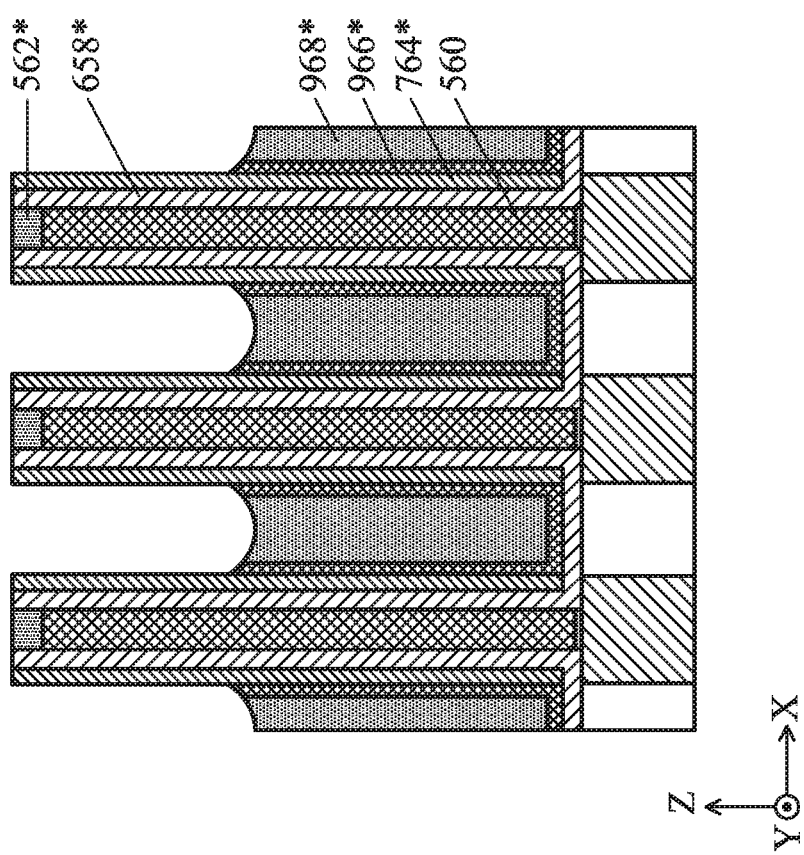

The removal of a portion of aluminum oxide layer 764 can be followed by the formation of etch stop layer 966 and inter-layer dielectric (ILD) 968, as shown in FIG. 9. The formation of etch stop layer 966 and ILD 968 can include deposition of an etch stop layer and inter-layer dielectric materials followed by a chemical mechanical polishing (CMP) process to coplanarize top surfaces of etch stop layer 966, ILD 968, aluminum oxide layer 764*, third gate spacer 658*, and nitride layer 562*. In some embodiments, the CMP process can stop on nitride layer 562*. The formation of etch stop layer 96 and ILD 968 can be followed by removal of a portion of ILD 968 and etch stop layer 966, as shown in FIG. 10.

Figure 11:
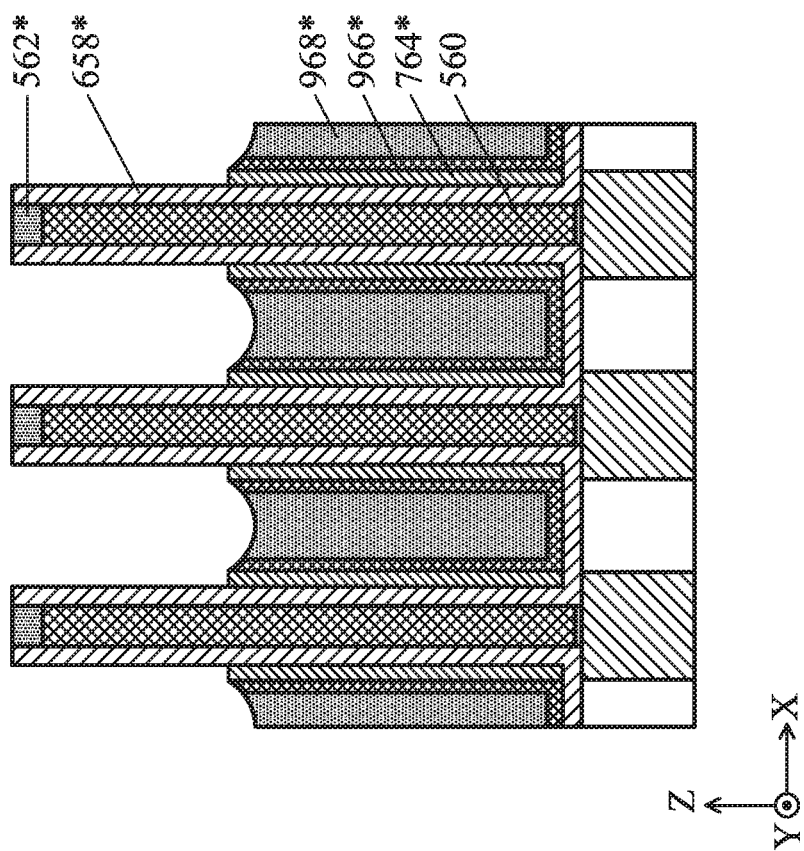

The removal of a portion of ILD 968 and etch stop layer 96 can be followed by removal of a portion of aluminum oxide layer 764* on sidewalls of sacrificial gate structures 560, as shown in FIG. 11, according to some embodiments. Referring to FIG. 11, a portion of aluminum oxide layer 764* can be removed by the radical-activated thermal ALE process discussed above using radical-activated thermal ALE system 100 shown in FIGS. 1 and 2. The radical-activated thermal ALE process can remove exposed aluminum oxide layer 764* on sidewalls of sacrificial gate structures 560 to form aluminum oxide layer 764**. In some embodiments, the radical-activated thermal ALE process can remove the portion of aluminum oxide layer 764* at a higher etching rate ranging from about 1 Å to about 5 Å per etching cycle. In addition, the radical-activated thermal ALE process may prevent etch stop layer 96*, ILD 968*, third gate spacer 658*, and nitride layer 562* from surface damage during the removal of the portion of aluminum oxide layer 764*.

The removal of the portion of aluminum oxide layer 764* on sidewalls of sacrificial gate structures 560 can be followed by formation of a hard mask layer 1270, as shown in FIG. 12. The formation of hard mask layer 1270 can include blanket deposition of dielectric materials for hard mask layer 1270 followed by a CMP process. The CMP process can stop on sacrificial gate structures 560* and coplanarize top surfaces of sacrificial gate structures 560*, third gate spacer 658**, and hard mask layer 1270. The formation of hard mask layer 1270 can be followed by removal of a portion of sacrificial gate structures 560*, third gate spacer 658, and aluminum oxide layer 764. In some embodiments, a portion of sacrificial gate structures 560* can be removed by an etching process (e.g., a Frontier etching process) and sacrificial gate structures 1360 of the remaining portion can have a height along a Z-axis ranging from about 10 nm to about 15 nm after the etching process. In some embodiments, a portion of third gate spacer 658** and aluminum oxide layer 764* can be removed from sidewalls and form third gate spacer 1358 and aluminum oxide layer 1364 having top surfaces aligned with sacrificial gate structures 1360.

In some embodiments, the portion of aluminum oxide layer 764 can be removed by the radical-activated thermal ALE process discussed above using radical-activated thermal ALE system 100 shown in FIGS. 1 and 2. The radical-activated thermal ALE process can remove the portion of aluminum oxide layer 764 on sidewalls to form aluminum oxide layer 1364. After the radical-activated thermal ALE process, aluminum oxide layer 1364 can have top surfaces aligned with sacrificial gate structures 1360. In some embodiments, the radical-activated thermal ALE process can remove the portion of aluminum oxide layer 764* at a higher etching rate ranging from about 1 Å to about 5 Å per etching cycle. In addition, the radical-activated thermal ALE process may prevent third gate spacer 1358, sacrificial gate structures 1360, etch stop layer 966*, and hard mask layer 1270 from surface damage during the removal of aluminum oxide layer 764**.

Figure 15:
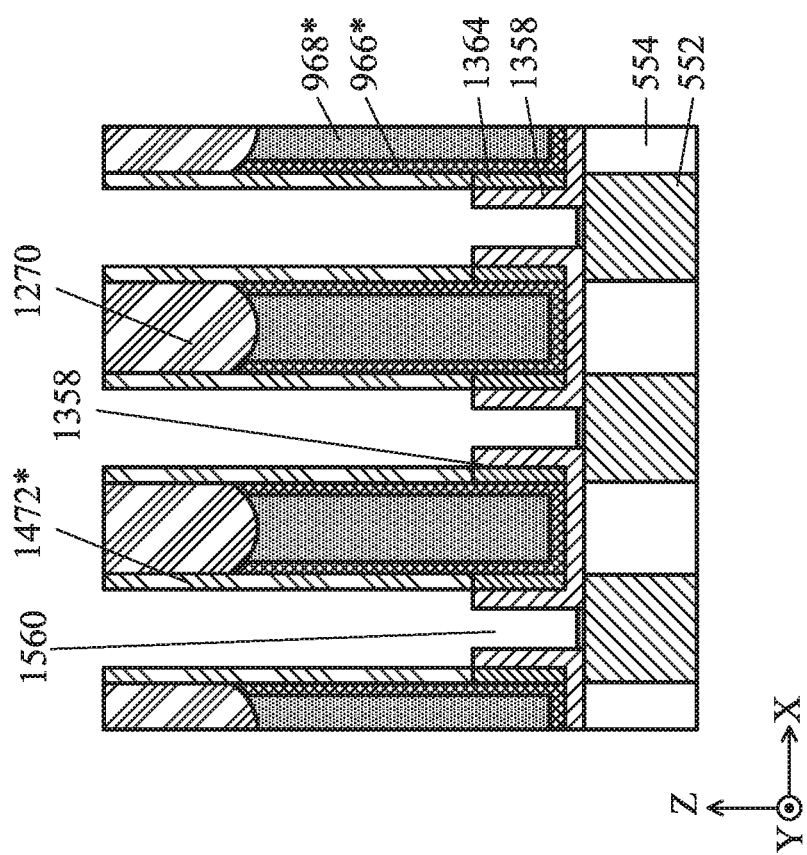
Figure 14:
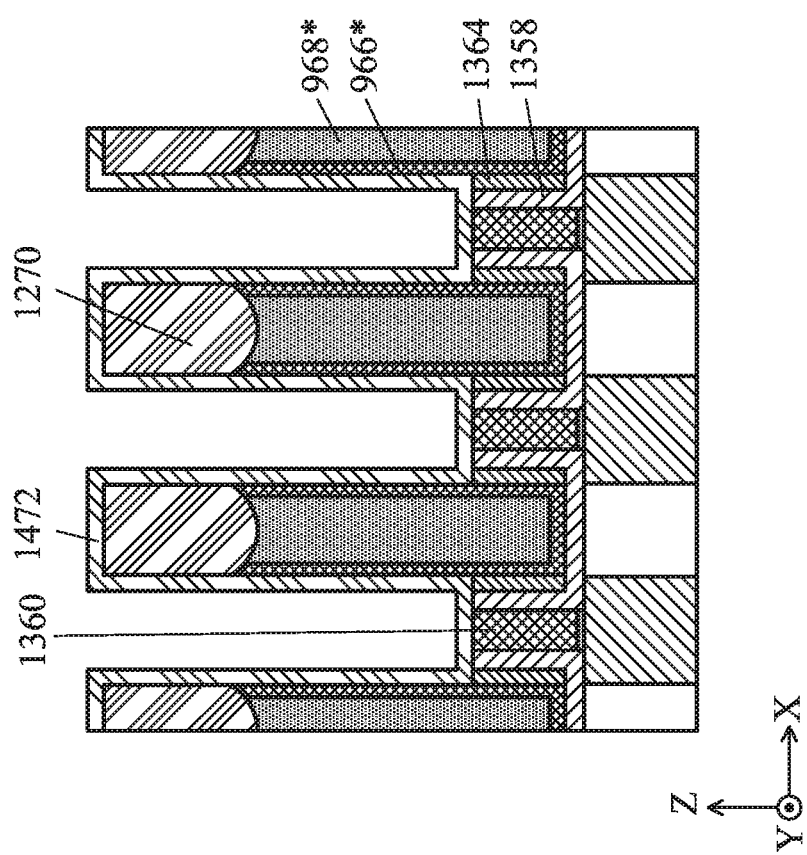

The removal of a portion of third gate spacer 658 and aluminum oxide layer 764 from sidewalls can be followed by a deposition of an oxide layer 1472, as shown in FIG. 14. In some embodiments, oxide layer 1472 can be blanket deposited by an ALD process on top surfaces of the structures in FIG. 13. The deposition of oxide layer 1472 can be followed by a removal of a portion of oxide layer 1472 and removal of sacrificial gate structures 1360, as shown in FIG. 15. In some embodiments, the removal of a portion of oxide layer 1472 can include a directional etching process and oxide layer 1472* on sidewalls can remain after the directional etching process. Sacrificial gate structures 1360 can be exposed for subsequent removal after the directional etching process. In some embodiments, the removal of sacrificial gate structures 1360 can include an etching process (e.g., a Selis etching process) with a nitrogen-based chemistry. Openings 1560 can be formed after the removal of sacrificial gate structures 1360.

The removal of sacrificial gate structures 1360 can be followed by the formation of gate structures 1672, as shown in FIG. 16. Gate structures 1672 can be formed on fin structures 552 in openings 1560. In some embodiments, each of gate structures 1672 can include a gate dielectric layer 1674 and a gate electrode 1676. Gate electrode 1676 can further include a work function layer 1680 and a metal fill 1684. In some embodiments, gate dielectric layer 1674 can include an interfacial layer and a high-k dielectric layer. In some embodiments, work function layer 1680 can include a stack of work function layers. In some embodiments, the formation of gate structures 1672 can include deposition of each layer of gate structures 1672 followed by a CMP process and an etching back process.

Figures 18A, 18B:
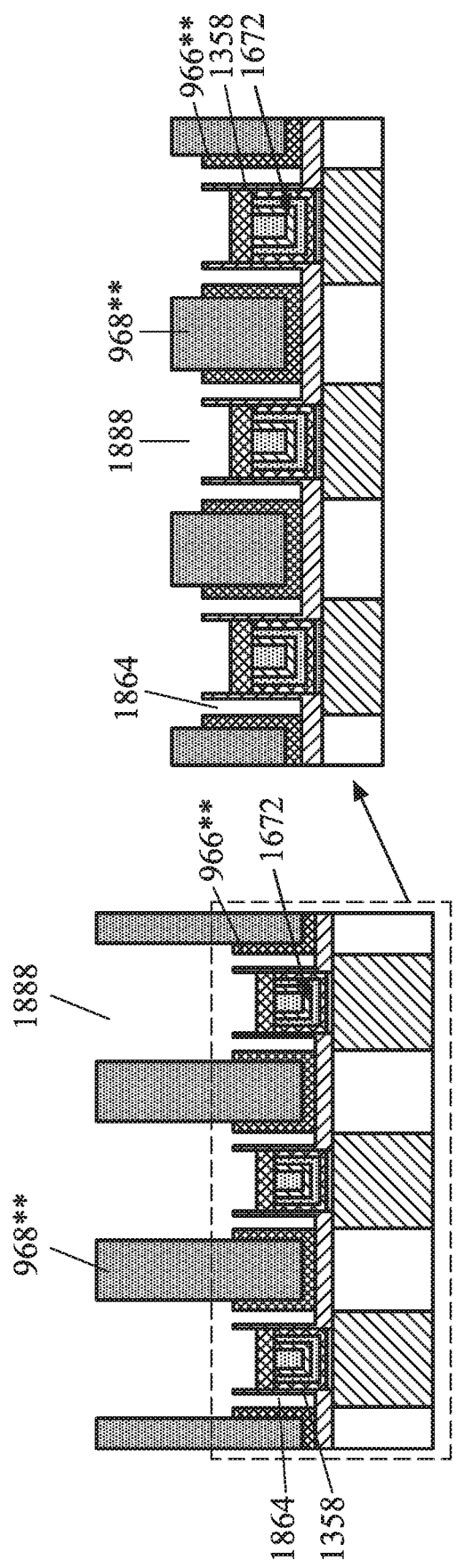

The formation of gate structures 1672 can be followed by blanket deposition of aluminum oxide layer 1786 and amorphous silicon 1788, as shown in FIG. 17. A CMP process can coplanarize top surfaces of aluminum oxide layer 1786, amorphous silicon 1788, etch stop layer 966*, and ILD 968. A cut process can separate gate structures 1672 as required by a design. Amorphous silicon 1788 can be removed following the cut process to form openings 1888 shown in FIGS. 18A and 18B. FIG. 18B illustrates an enlarged view of region B in FIG. 18A. The removal of amorphous silicon 1788 can be followed by removal of aluminum oxide layer 1786 and aluminum oxide layer 1364. Air gaps 1864 can be formed after the removal of aluminum oxide layer 1364.

In some embodiments, aluminum oxide layer 1786 and aluminum oxide layer 1364 can be removed by the radical-activated thermal ALE process discussed above using radical-activated thermal ALE system 100 shown in FIGS. 1 and 2. The radical-activated thermal ALE process can remove aluminum oxide layer 1786 after the removal of amorphous silicon 1788. The radical-activated thermal ALE process can further remove aluminum oxide layer 1364 between etch stop layer 966* and third gate spacer 1358 to form air gaps 1864. In some embodiments, the radical-activated thermal ALE process can remove aluminum oxide layer 1786 and aluminum oxide layer 1364 at a higher etching rate ranging from about 1 Å to about 5 Å per etching cycle. In addition, the radical-activated thermal ALE process may prevent third gate spacer 1358, ILD 968*, and etch stop layer 966** from surface damage during the removal of aluminum oxide layer 1786 and aluminum oxide layer 1364.

Figures 19A, 19B:
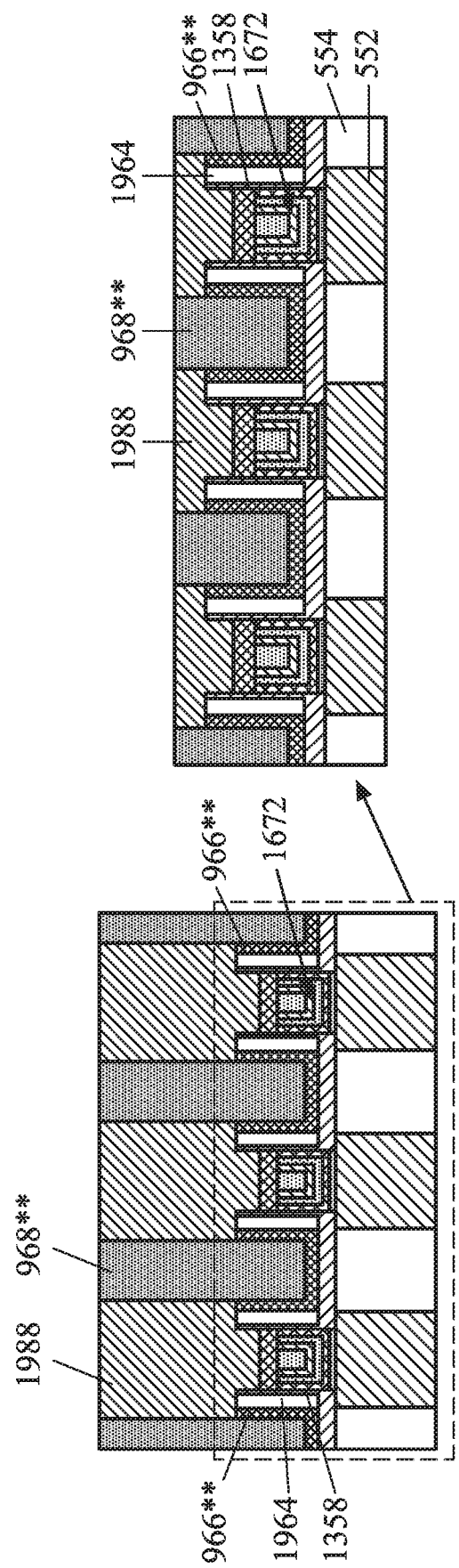
Figures 20A, 20B:
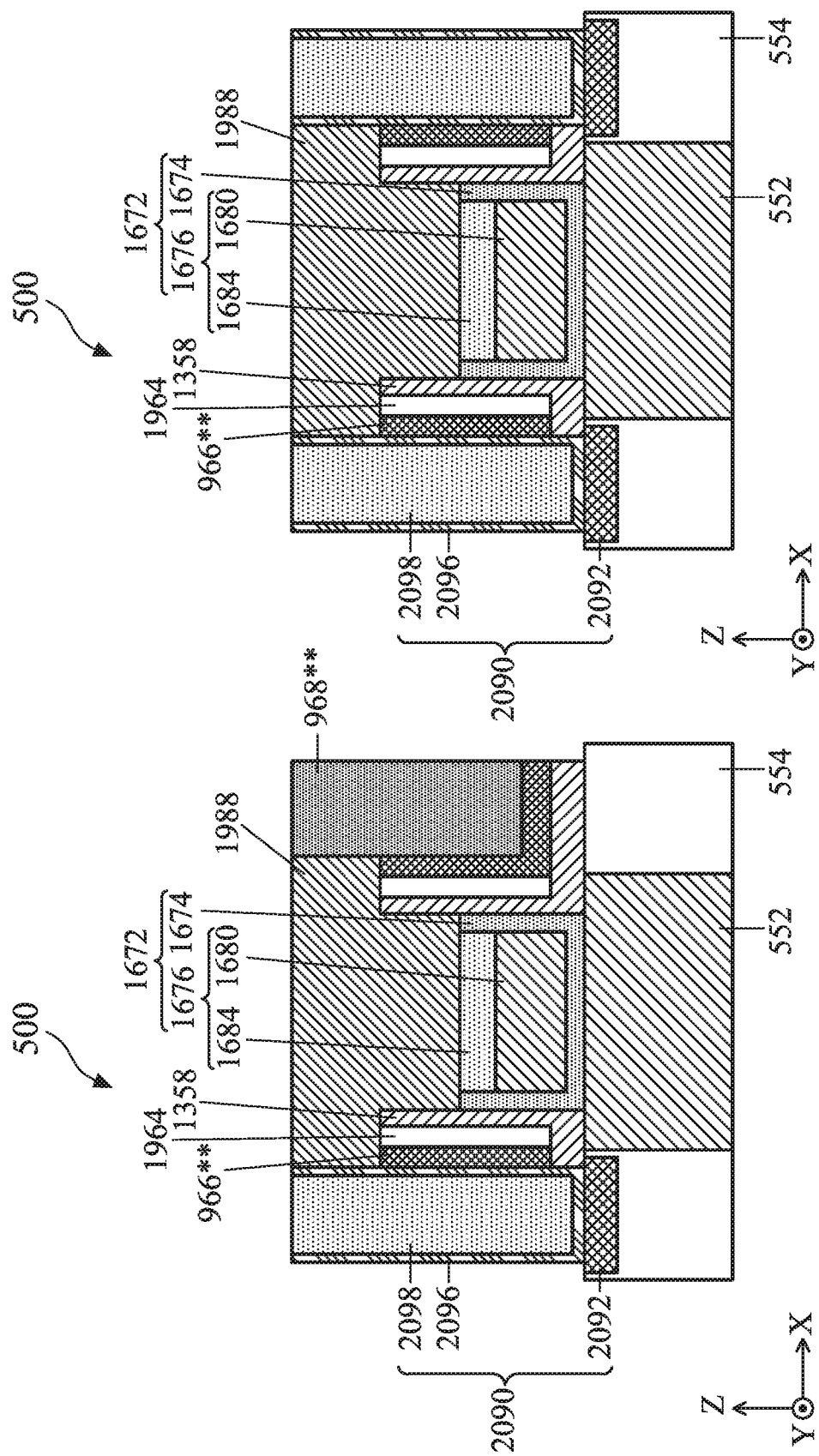

The removal of aluminum oxide layer 1786 and aluminum oxide layer 1364 can be followed by formation of capping structures 1988, as shown in FIGS. 19A and 19B. FIG. 19B illustrates an enlarged view of region B in FIG. 19A. The formation of capping structures 1988 can include deposition of dielectric materials capping on gate structures 1672 and sealing air gaps 1864 to form air spacers 1964. In some embodiments, air spacers 1964 can have a width along an X-axis ranging from about 2 nm to about 4 nm and a depth along a Z-axis ranging from about 16 nm to about 25 nm. An aspect ratio of the height to the width for air spacers 1964 can range from about 4 to about 12. The formation of capping structures 1988 and air spacers 1964 can be followed by formation of source/drain (S/ID) contact structures 2090 in contact with epitaxial fin structures 554, as shown in FIGS. 20A and 20B. Referring to FIGS. 20A and 20B, S/D contact structures 2090 can include a silicide layer 2092, a metal liner 2096, and a metal contact 2098. In some embodiments, an epitaxial fin structures 554 of a finFET may not be connected to an S/D contact structure and ILD 968* can remain on epitaxial fin structures 554, as shown in FIG. 20A. In some embodiments, ILD 968** can be removed and epitaxial fin structures 554 of a finFET can be connected to S/D contact structures 2090, as shown in FIG. 20B. In some embodiments, air spacers 1964 can reduce parasitic capacitances between gate structures 1672 and S/D contact structures 2090 and improve device performance of semiconductor device 500.

Various embodiments of the present disclosure provide an exemplary radical-activated thermal atomic layer etching (ALE) process performed in exemplary radical-activated thermal ALE system 100. In some embodiments, the radical-activated thermal ALE process can activate a ligand exchange reaction on a surface of a metal oxide on wafer 112 using radicals 136 with increased kinetic energies, thereby increasing an etch rate of the metal oxide and increasing the etch selectivity between the metal oxide and adjacent materials on wafer 112.

In some embodiments, the radical-activated thermal ALE process can include three sequential reaction cycles: (i) a surface modification cycle, (ii) a material removal cycle, and (iii) a surface cleaning cycle. In some embodiments, the radical-activated thermal ALE process can modify the surface of the metal oxide layer on wafer 112 with radicals from a plasma during the surface modification cycle. The material removal cycle can include a ligand exchange reaction, which can be performed under a thermal condition. In some embodiments, radicals 136 generated from ions of a plasma having increased kinetic energy can increase the ligand exchange kinetic energy and the speed of the ligand exchange reaction, thus increasing removal of the modified surface of the metal oxide and the etching rate of the metal oxide. In some embodiments, gas distribution plate 126 with evenly distributed holes or openings can distribute the gases and plasmas uniformly across wafer 112. In some embodiments, radical-activated thermal ALE system 100 can include grid system 124 to increase a kinetic energy of ions from the plasma and neutralizer 122 to neutralize the ions. Grid system 124 can include screen grid 130 to screen ions having appropriate angles (e.g., about 90 degrees relative to screen grid 130), accelerator grid 132 to increase kinetic energies of the ions, and decelerator grid 134 to reduce divergence of the beam of the ions and block electrons generated by neutralizer 122 from entering grid system 124. Neutralizer 122 can generate electrons and neutralize the ions to form radicals 136 with increased kinetic energies. The material removal cycle can remove the modified material layer at a higher etching rate while keeping the unmodified material(s) or layers intact. In some embodiments, a flush of radicals during the surface cleaning cycle can remove surface ligand residues and byproducts and create a fresh surface for the next etching cycle. The radical flush can further increase the etching rate of the radical-activated thermal ALE process.

In some embodiments, a system includes a chamber, a wafer holder in the chamber configured to hold a wafer with a metal oxide disposed thereon, a plasma generator configured to generate a plasma from a gas, a grid system configured to increase a kinetic energy of ions from the plasma, and a neutralizer configured to generate electrons to neutralize the ions and generate radicals to facilitate etching of the metal oxide.

In some embodiments, a system includes a chamber, a wafer holder in the chamber configured to hold a wafer with a metal oxide disposed thereon, a first gas line fluidly connected to the chamber and configured to deliver a gas to the chamber, a plasma generator configured to generate a plasma from the gas, a grid system between the plasma generator and the wafer holder configured to increase a kinetic energy of ions from the plasma, a neutralizer between the grid system and the wafer holder and configured to generate electrons and neutralize the ions to generate radicals, and a second gas line fluidly connected to the chamber and configured to deliver a precursor across the wafer. The radicals facilitate etching of the metal oxide by the precursor.

In some embodiments, a method includes generating a plasma from a gas, generating with a grid system and a neutralizer radicals from the plasma, and activating a ligand exchange reaction on a surface of a metal oxide with the radicals. The grid system includes a screen grid, an accelerator grid, and a decelerator grid.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
a chamber;
a wafer holder, in the chamber, configured to hold a wafer with a metal oxide disposed thereon;
a plasma generator configured to generate a plasma from a gas;
a grid system, between the plasma generator and the wafer holder, configured to increase a kinetic energy of ions from the plasma;
a neutralizer, below the grid system, configured to generate electrons to neutralize the ions into radicals; and
a vaporizer, below the neutralizer, connected to a sidewall of the chamber adjacent to the neutralizer and the wafer holder and configured to vaporize a precursor over the wafer.

2. The system of claim 1, wherein the grid system comprises a screen grid configured to separate the ions from the plasma.

3. The system of claim 1, wherein the grid system comprises an accelerator grid configured to accelerate the ions from the plasma.

4. The system of claim 1, wherein the grid system comprises a decelerator grid configured to block the electrons from the grid system.

5. The system of claim 1, further comprising a heating system configured to heat the wafer.

6. The system of claim 1, further comprising a gas distribution plate, above the grid system, configured to distribute the gas uniformly across the chamber.

7. The system of claim 1, wherein the gas comprises fluorine to facilitate the radicals to fluorinate a surface of the metal oxide.

8. The system of claim 1, wherein the gas comprises an inert gas to facilitate the radicals in a ligand exchange reaction on a surface of the metal oxide.

9. The system of claim 1, wherein the gas comprises hydrogen to facilitate the radicals to clean a surface of the metal oxide.

10. The system of claim 1, wherein the metal oxide comprises hafnium oxide, aluminum oxide, or zirconium oxide.

11. A system, comprising:
a chamber;
a wafer holder, at a bottom portion of the chamber, configured to hold a wafer with a metal oxide disposed thereon;
a first gas line fluidly connected to a top portion of the chamber and configured to deliver a gas to the chamber;
a plasma generator configured to generate a plasma from the gas;
a grid system, between the plasma generator and the wafer holder, configured to increase a kinetic energy of ions from the plasma;
a neutralizer, downstream of the grid system, configured to generate electrons and neutralize the ions into radicals; and
a second gas line, adjacent to the wafer holder, fluidly connected to the chamber and configured to deliver a precursor downstream of the neutralizer, wherein the radicals activate the precursor for the wafer.

12. The system of claim 11, wherein the grid system comprises:
an accelerator grid configured to accelerate the ions from the plasma;
a screen grid, between the accelerator grid and the plasma generator, configured to separate the ions from the plasma; and
a decelerator grid, between the accelerator grid and the wafer holder, configured to block the electrons.

13. A system, comprising:
a wafer holder, configured to hold and heat a wafer with a metal oxide disposed thereon;
a plasma generator configured to generate a plasma from a gas;
a grid system, between the plasma generator and the wafer holder, configured to increase a kinetic energy of ions from the plasma;
a neutralizer, downstream of the grid system, configured to generate electrons to neutralize the ions into radicals with the electrons; and
a vaporizer, downstream of the neutralizer, configured to vaporize a precursor between the radicals and the wafer.

14. The system of claim 13, wherein the grid system comprises:
an accelerator grid configured to accelerate the ions from the plasma;
a screen grid, between the accelerator grid and the plasma generator, configured to separate the ions from the plasma; and
a decelerator grid, between the accelerator grid and the wafer holder, configured to block the electrons.

15. The system of claim 14, wherein the accelerator grid comprises a first aperture having a first diameter and the screen grid comprises a second aperture having a second diameter larger than the first diameter.

16. The system of claim 14, wherein the accelerator grid comprises a first aperture having a first diameter and the decelerator grid comprises a second aperture having a second diameter larger than the first diameter.

17. The system of claim 6, wherein the plasma generator is between the gas distribution plate and the grid system.

18. The system of claim 11, wherein the wafer holder comprises a heater configured to heat the wafer.

19. The system of claim 11, further comprising a gas distribution plate adjacent to the first gas line and configured to distribute the gas uniformly for the plasma generator.

20. The system of claim 19, wherein the plasma generator is between the gas distribution plate and the grid system.

* * * * *